US012748951B2

(12) United States Patent
Kim et al.

(10) Patent No.: US 12,748,951 B2
(45) Date of Patent: Sep. 29, 2026

(54) ENCODING METHOD AND NEURAL NETWORK ENCODER STRUCTURE USABLE IN WIRELESS COMMUNICATION SYSTEM

(71) Applicant: LG ELECTRONICS INC., Seoul (KR)

(72) Inventors: Bonghoe Kim, Seoul (KR); Jongwoong Shin, Seoul (KR); Byounghoon Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 745 days.

(21) Appl. No.: 18/025,227

(22) PCT Filed: Sep. 9, 2020

(86) PCT No.: PCT/KR2020/012173

§ 371 (c)(1),
(2) Date: Mar. 8, 2023

(87) PCT Pub. No.: WO2022/054980

PCT Pub. Date: Mar. 17, 2022

(65) Prior Publication Data

US 2023/0325638 A1 Oct. 12, 2023

(51) Int. Cl.

*G06N 3/0455* (2023.01)
*G06N 3/048* (2023.01)
*H03M 13/27* (2006.01)

(52) U.S. Cl.

CPC .......... *G06N 3/0455* (2023.01); *G06N 3/048* (2023.01); *H03M 13/27* (2013.01)

(58) Field of Classification Search

CPC ........ G06N 3/04; G06N 3/0455; G06N 3/048; G06N 3/08; G06N 3/063; G06T 7/70;
(Continued)

(56) References Cited

U.S. PATENT DOCUMENTS

| | | | | |
|---|---|---|---|---|
| 5,946,357 A * | 8/1999 | Sandin | H04L 1/0071 714/755 |
| 2018/0157966 A1* | 6/2018 | Henry | G06F 17/153 |

(Continued)

FOREIGN PATENT DOCUMENTS

| | | |
|---|---|---|
| JP | 08-063203 A | 3/1996 |
| KR | 10-2000-0070217 A | 11/2000 |

(Continued)

OTHER PUBLICATIONS

Dekkers, Gert, et al. "A multi-layered energy consumption model for smart wireless acoustic sensor networks." arXiv preprint arXiv: 1812.06672 (2018). (Year: 2018).*

(Continued)

*Primary Examiner* — Randall K. Baldwin
(74) *Attorney, Agent, or Firm* — BRYAN CAVE LEIGHTON PAISNER LLP

(57) ABSTRACT

Provided are an encoding method performed by a neural network encoder in a wireless communication system and the neural network encoder. The method includes a first encoding step of encoding input data transmitted from a higher layer, an interleaving step of performing interleaving on a first output which is an output of the first encoding step and a second encoding step of encoding a second output which is an output obtained by interleaving the first output. Here, each of the first encoding step and the second encoding step is performed based on one or more neural networks.

14 Claims, 37 Drawing Sheets

(58) Field of Classification Search

CPC ........... G06T 7/90; G06F 15/18; G05B 13/02; H03M 13/23; H03M 13/27; H03M 9/00; H04B 7/00

See application file for complete search history.

(56) References Cited

U.S. PATENT DOCUMENTS

| | | | | |
|---|---|---|---|---|
| 2019/0385325 | A1* | 12/2019 | Kweon | G06N 3/088 |
| 2021/0048991 | A1* | 2/2021 | Tanner | G06F 8/4434 |

FOREIGN PATENT DOCUMENTS

| | | | | |
|---|---|---|---|---|
| KR | 10-2001-0084779 | A | | 9/2001 |
| KR | 20010084779 | A | * | 9/2001 |
| KR | 10-2018-0062911 | A | | 6/2018 |
| KR | 10-2018-0096984 | A | | 8/2018 |

OTHER PUBLICATIONS

Sattiraju, Raja, Andreas Weinand, and Hans D. Schotten. "Performance analysis of deep learning based on recurrent neural networks for channel coding." 2018 IEEE International Conference on Advanced Networks and Telecommunications Systems (ANTS). IEEE, 2018. (Year: 2018).*

Jagannath, Jithin, et al. "Machine learning for wireless communications in the Internet of Things: A comprehensive survey." Ad Hoc Networks 93 (2019): 101913. (Year: 2019).*

Ali, Samad, et al. "6G white paper on machine learning in wireless communication networks." arXiv preprint arXiv:2004.13875 (Apr. 2020). (Year: 2020).*

Chen, Mingzhe, et al. "Artificial neural networks-based machine learning for wireless networks: A tutorial." IEEE Communications Surveys & Tutorials 21.4 (2019): 3039-3071. (Year: 2019).*

Jiang et al., "Turbo Autoencoder: Deep learning based channel codes for point-to-point communication channels," arXiv: 1911.03038, 19 pages 2019.

* cited by examiner (control plane)

(user plane)

1200

$$\frac{\delta z}{\delta x} = \frac{\delta z}{\delta y1}\frac{\delta y1}{\delta x} + \frac{\delta z}{\delta y2}\frac{\delta y2}{\delta x}$$

$$\frac{\delta z}{\delta x} = \sum_{i=1}^{n} \frac{\delta z}{\delta yi}\frac{\delta yi}{\delta x}$$

ENCODING METHOD AND NEURAL NETWORK ENCODER STRUCTURE USABLE IN WIRELESS COMMUNICATION SYSTEM

CROSS-REFERENCE TO RELATED APPLICATIONS

This application is the National Stage filing under 35 U.S.C. 371 of International Application No. PCT/KR2020/012173, filed on Sep. 9, 2020, the contents of which are hereby incorporated by reference herein in their entirety.

BACKGROUND OF THE DISCLOSURE

Field of the Disclosure

This specification relates to wireless communication and AI.

Related Art 6G systems are aimed at (i) very high data rates per device, (ii) very large numbers of connected devices, (iii) global connectivity, (iv) very low latency, and (v) battery-free lower energy consumption of IoT devices, (vi) ultra-reliable connection, (vii) connected intelligence with machine learning capabilities. The vision of 6G systems can be four aspects: intelligent connectivity, deep connectivity, holographic connectivity and ubiquitous connectivity.

Recently, attempts have been made to integrate AI with wireless communication systems. This has been focused on the field of application layer, network layer, and in particular, wireless resource management and allocation using deep learning. However, these studies are gradually developing into the MAC layer and the physical layer, in particular, attempts are being made to combine deep learning with wireless transmission in the physical layer. AI-based physical layer transmission refers to applying a signal processing and communication mechanism based on an AI driver rather than a traditional communication framework in fundamental signal processing and communication mechanisms. For example, it may include deep learning-based channel coding and decoding, deep learning-based signal estimation and detection, deep learning-based MIMO mechanism, AI-based resource scheduling (scheduling) and allocation.

Various attempts have been made to apply neural networks to communication systems. Among them, attempts to apply to the physical layer are mainly considering optimizing a specific function of a receiver. For example, performance can be improved by configuring a channel decoder as a neural network. Alternatively, performance may be improved by implementing a MIMO detector as a neural network in a MIMO system having a plurality of transmit/receive antennas.

Another approach is to construct both a transmitter and a receiver as a neural network and perform optimization from an end-to-end perspective to improve performance, which is called an autoencoder.

SUMMARY OF THE DISCLOSURE

This specification proposes a neural network encoder structure and encoding method usable in a wireless communication system.

Transmitters and receivers composed of neural networks can be designed through end-to-end optimization. In addition, complexity can be improved by designing the neural network encoder to improve the distance characteristic of codewords. In addition, system performance can be optimized by signaling information on neural network parameters of a neural network encoder and a neural network decoder.

Effects that can be obtained through specific examples of the present specification are not limited to the effects listed above. For example, various technical effects that a person having ordinary skill in the related art can understand or derive from this specification may exist. Accordingly, the specific effects of the present specification are not limited to those explicitly described herein, and may include various effects that can be understood or derived from the technical characteristics of the present specification.

BRIEF DESCRIPTION OF THE DRAWINGS

The accompanying drawings are provided to aid understanding of the present disclosure, and may provide embodiments of the present disclosure together with detailed descriptions. However, the technical features of the present disclosure are not limited to specific drawings, and features disclosed in each drawing may be combined with each other to form a new embodiment. Reference numerals in each drawing may mean structural elements.

DESCRIPTION OF EXEMPLARY EMBODIMENTS

Figure 1:
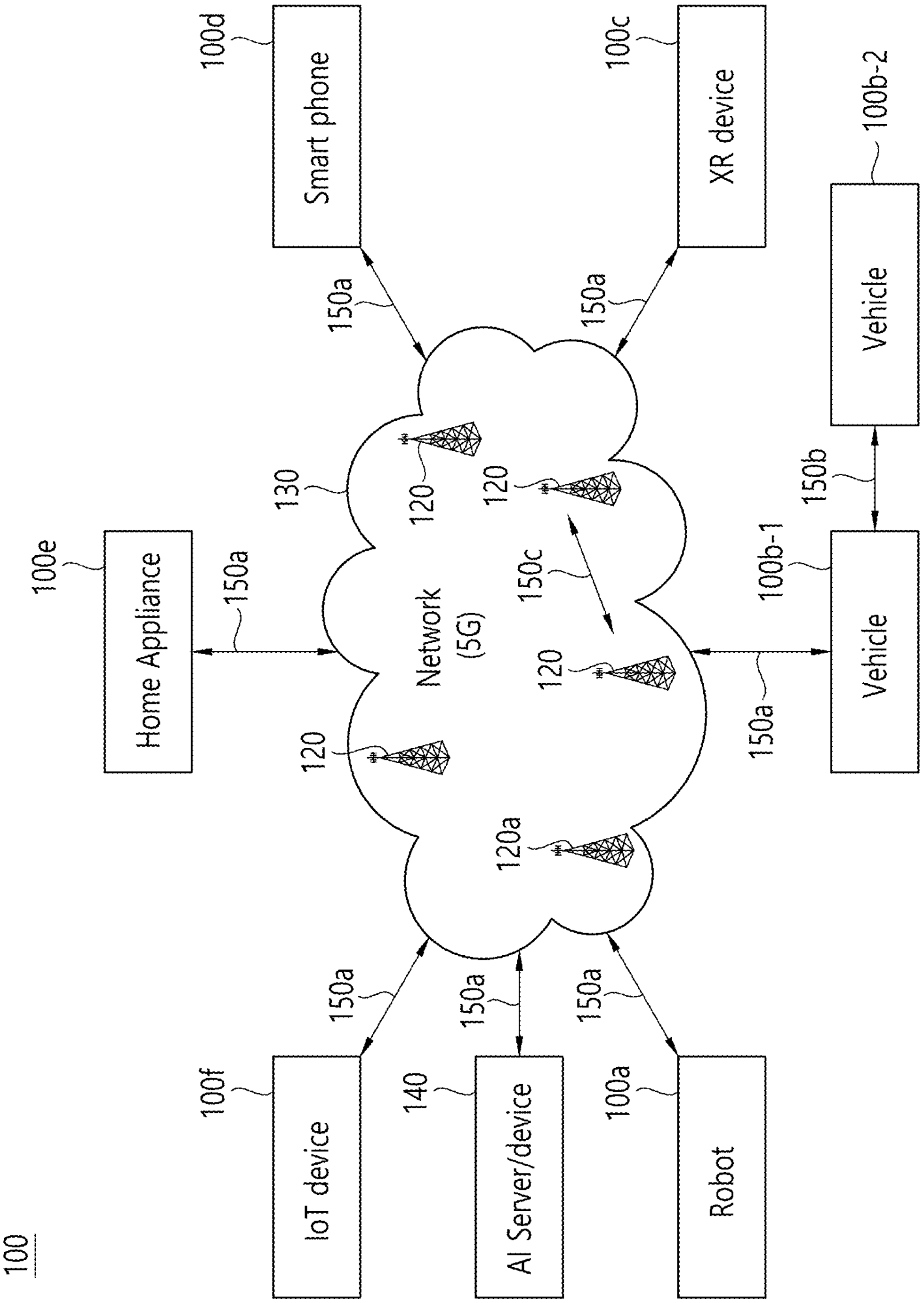
FIG. 1 is a diagram illustrating an example of a communication system applicable to the present disclosure.

The following embodiments are those that combine elements and features of the present disclosure in a predetermined form. Each component or feature may be considered optional unless explicitly stated otherwise. Each component or feature may be implemented in a form not combined with other components or features. In addition, an embodiment of the present disclosure may be configured by combining some elements and/or features. The order of operations described in the embodiments of the present disclosure may be changed. Some components or features of one embodiment may be included in another embodiment, or may be replaced with corresponding components or features of another embodiment.

In the description of the drawings, procedures or steps that may obscure the gist of the present disclosure have not been described, and procedures or steps that can be understood by those skilled in the art have not been described.

Throughout the specification, when a part is said to "comprising" or "including" a certain element, it means that it may further include other elements, not excluding other elements, unless otherwise stated. In addition, terms such as ". . . unit", ". . . er", and "module" described in the specification mean a unit that processes at least one function or operation. It can be implemented in hardware or software or a combination of hardware and software. Also, "a or an", "one", "the" and similar related words in the context of describing the present disclosure (particularly in the context of the claims below), unless indicated or otherwise clearly contradicted by context, it can be used in a meaning including both singular and plural.

Embodiments of the present disclosure in this specification have been described with a focus on a data transmission/reception relationship between a base station and a mobile station. Here, a base station has meaning as a terminal node of a network that directly communicates with a mobile station. A specific operation described as being performed by a base station in this document may be performed by an upper node of the base station in some cases.

That is, in a network composed of a plurality of network nodes including a base station, various operations performed for communication with a mobile station may be performed by the base station or other network nodes other than the base station. At this time, the 'base station' may be replaced by a term such as a fixed station, a Node B, an eNode B, a gNode B, a ng-eNB, an advanced base station (ABS) or an access point, etc.

In addition, in the embodiments of the present disclosure, a terminal may be replaced with terms such as a user equipment (UE), a mobile station (MS), a subscriber station (SS), a mobile subscriber station (MSS), a mobile terminal or an advanced mobile station (AMS), etc.

In addition, the transmitting end refers to a fixed and/or mobile node providing data service or voice service, and the receiving end refers to a fixed and/or mobile node receiving data service or voice service. Therefore, in the case of uplink, the mobile station can be a transmitter and the base station can be a receiver. Similarly, in the case of downlink, the mobile station may be a receiving end and the base station may be a transmitting end.

Embodiments of the present disclosure may be supported by standard documents disclosed in at least one of wireless access systems, such as an IEEE 802.xx system, a 3rd Generation Partnership Project (3GPP) system, a 3GPP Long Term Evolution (LTE) system, a 3GPP 5G (5th generation) NR (New Radio) system and a 3GPP2 system. In particular, embodiments of the present disclosure may be supported by 3GPP technical specification (TS) 38.211, 3GPP TS 38.212, 3GPP TS 38.213, 3GPP TS 38.321, and 3GPP TS 38.331 documents.

In addition, embodiments of the present disclosure may be applied to other wireless access systems, and are not limited to the above-described systems. For example, it may also be applicable to a system applied after the 3GPP 5G NR system, and is not limited to a specific system.

That is, obvious steps or parts not described in the embodiments of the present disclosure may be described with reference to the above documents. In addition, all terms disclosed in this document can be explained by the standard document.

Hereinafter, preferred embodiments according to the present disclosure will be described in detail with reference to the accompanying drawings. The detailed description set forth below in conjunction with the accompanying drawings is intended to describe exemplary embodiments of the present disclosure, and is not intended to represent the only embodiments in which the technical configurations of the present disclosure may be practiced.

In addition, specific terms used in the embodiments of the present disclosure are provided to aid understanding of the present disclosure, and the use of these specific terms may be changed in other forms without departing from the technical spirit of the present disclosure.

The following technologies can be applied to various wireless access systems such as code division multiple access (CDMA), frequency division multiple access (FDMA), time division multiple access (TDMA), orthogonal frequency division multiple access (OFDMA), single carrier frequency division multiple access (SC-FDMA), and the like.

In order to clarify the following description, a description will be made based on a 3GPP communication system (e.g., LTE, NR, etc.), but the technical spirit of the present disclosure is not limited thereto. LTE may refer to technology from after 3GPP TS 36.xxx Release 8. In detail, LTE technology from after 3GPP TS 36.xxx Release 10 may be referred to as LTE-A, and LTE technology from after 3GPP TS 36.xxx Release 13 may be referred to as LTE-A pro. 3GPP NR may mean technology from after TS 38.xxx Release 15. 3GPP 6G may mean technology from after TS Release 17 and/or Release 18. "xxx" means standard document detail number. LTE/NR/6G may be collectively referred to as a 3GPP system.

For background art, terms, abbreviations, etc. used in the present disclosure, reference may be made to matters described in standard documents published prior to the present disclosure. As an example, 36.xxx and 38.xxx standard documents may be referred to.

Hereinafter, a communication system applicable to the present disclosure will be described.

Although not limited thereto, various descriptions, functions, procedures, proposals, methods and/or operational flowcharts of the present disclosure disclosed in this document may be applied to various fields requiring wireless communication/connection (e.g., 5G) between devices.

Hereinafter, it will be exemplified in more detail with reference to the drawings. In the following drawings/description, the same reference numerals may represent the same or corresponding hardware blocks, software blocks or functional blocks unless otherwise specified.

FIG. 1 illustrates a communication system applied to the present disclosure. Referring to FIG. 1, the communication system 100 applied to the present disclosure includes a wireless device, a base station, and a network. Here, the wireless device refers to a device that performs communication using a wireless access technology (e.g., 5G NR, LTE), and may be referred to as a communication/wireless/5G device. Although not limited thereto, the wireless device may include a robot 100*a*, a vehicle 100*b*-1, 100*b*-2, an extended Reality (XR) device 100*c*, a hand-held device 100*d*, and a home appliance 100*e*, an Internet of Things (IoT) device 100*f*, and an AI device/server 140. For example, the vehicle may include a vehicle equipped with a wireless communication function, an autonomous driving vehicle, a vehicle capable of performing inter-vehicle communication, and the like. Here, the vehicle 100*b*-1, 100*b*-2 may include an Unmanned Aerial Vehicle (UAV) (e.g., a drone). XR devices 100*c* include AR (Augmented Reality)/VR (Virtual Reality)/MR (Mixed Reality) devices, and it may be implemented in the form of a Head-Mounted Device (HMD), a Head-Up Display (HUD) provided in a vehicle, a television, a smartphone, a computer, a wearable device, a home appliance, a digital signage, a vehicle, a robot, and the like. The portable device 100*d* may include a smart phone, a smart pad, a wearable device (e.g., a smart watch, smart glasses), a computer (e.g., a laptop computer), and the like. Home appliances 100*e* may include a TV, a refrigerator, a washing machine, and the like. The IoT device 100*f* may include a sensor, a smart meter, and the like. For example, the base station 120 and the network 130 may be implemented as a wireless device, and a specific wireless device 120*a* may operate as a base station/network node to other wireless devices.

The wireless devices 100*a* to 100*f* may be connected to the network 130 via the BSs 120. An AI technology may be applied to the wireless devices 100*a* to 100*f* and the wireless devices 100*a* to 100*f* may be connected to the AI server 100*g* via the network 130. The network 130 may be configured using a 3G network, a 4G (e.g., LTE) network, or a 5G (e.g., NR) network. Although the wireless devices 100*a* to 100*f* may communicate with each other through the BSs 120/network 130, the wireless devices 100*a* to 100*f* may perform direct communication (e.g., sidelink communication) with each other without passing through the BSs 120/network 130. For example, the vehicles 100*b*-1 and 100*b*-2 may perform direct communication (e.g. Vehicle-to-Vehicle (V2V)/Vehicle-to-everything (V2X) communication). In addition, the IoT device 100*f* (e.g., a sensor) may perform direct communication with other IoT devices (e.g., sensors) or other wireless devices 100*a* to 100*f*.

Wireless communication/connections 150*a*, 150*b*, or 150*c* may be established between the wireless devices 100*a* to 100*f*/BS 120, or BS 120/BS 120. Herein, the wireless communication/connections may be established through various RATs (e.g., 5G NR) such as uplink/downlink communication 150*a*, sidelink communication 150*b* (or, D2D communication), or inter BS communication 150*c* (e.g. relay, Integrated Access Backhaul (IAB)). The wireless devices and the BSs/the wireless devices may transmit/receive radio signals to/from each other through the wireless communication/connections 150*a*, 150*b* and 150*c*. For example, the wireless communication/connections 150*a*, 150*b* and 150*c* may transmit/receive signals through various physical channels. To this end, at least a part of various configuration information configuring processes, various signal processing processes (e.g., channel encoding/decoding, modulation/demodulation, and resource mapping/demapping), and resource allocating processes, for transmitting/receiving radio signals, may be performed based on the various proposals of the present disclosure.

Figure 2:
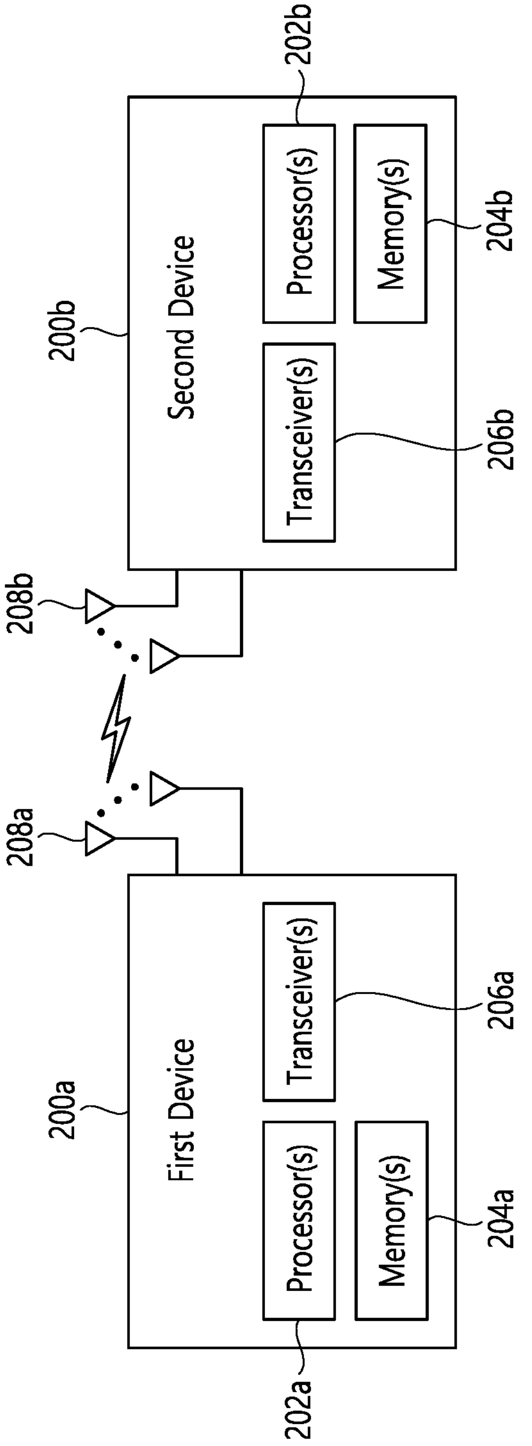
FIG. 2 is a diagram illustrating an example of a wireless device applicable to the present disclosure.

FIG. 2 illustrates a wireless device applicable to the present disclosure.

Referring to FIG. 2, the first wireless device 200*a* and the second wireless device 200*b* may transmit and receive wireless signals through various wireless access technologies (e.g., LTE, NR). Here, {first wireless device 200*a*, second wireless device 200*b*} may correspond to {wireless device, base station 120} and/or {wireless device, wireless device} of FIG. 1.

The first wireless device 200*a* may include one or more processors 202*a* and one or more memories 204*a* and additionally further include one or more transceivers 206*a* and/or one or more antennas 208*a*. The processors 202*a* may control the memory 204*a* and/or the transceivers 206*a* and may be configured to implement the descriptions, functions, procedures, proposals, methods, and/or operational flowcharts disclosed in this document. For example, the processors 202*a* may process information within the memory 204*a* to generate first information/signals and then transmit radio signals including the first information/signals through the transceivers 206*a*. In addition, the processor 202*a* may receive radio signals including second information/signals through the transceiver 206*a* and then store information obtained by processing the second information/signals in the memory 204*a*. The memory 204*a* may be connected to the processor 202*a* and may store a variety of information related to operations of the processor 202*a*. For example, the memory 204*a* may store software code including commands for performing a part or the entirety of processes controlled by the processor 202*a* or for performing the descriptions, functions, procedures, proposals, methods, and/or operational flowcharts disclosed in this document. Herein, the processor 202*a* and the memory 204*a* may be a part of a communication modem/circuit/chip designed to implement RAT (e.g., LTE or NR). The transceiver 206*a* may be connected to the processor 202*a* and transmit and/or receive radio signals through one or more antennas 208*a*. The transceiver 206*a* may include a transmitter and/or a receiver. The transceiver 206*a* may be interchangeably used with a radio frequency (RF) unit. In the present disclosure, the wireless device may represent a communication modem/circuit/chip.

The second wireless device 200*b* may include one or more processors 202*b* and one or more memories 204*b* and additionally further include one or more transceivers 206*b* and/or one or more antennas 208*b*. The processor 202*b* may control the memory 204*b* and/or the transceiver 206*b* and may be configured to implement the descriptions, functions, procedures, proposals, methods, and/or operational flowcharts disclosed in this document. For example, the processor 202*b* may process information within the memory 204*b* to generate third information/signals and then transmit radio signals including the third information/signals through the transceiver 206*b*. In addition, the processor 202*b* may receive radio signals including fourth information/signals through the transceiver 206*b* and then store information obtained by processing the fourth information/signals in the memory 204*b*. The memory 204*b* may be connected to the processor 202*b* and may store a variety of information related to operations of the processor 202*b*. For example, the memory 204*b* may store software code including commands for performing a part or the entirety of processes controlled by the processor 202*b* or for performing the descriptions, functions, procedures, proposals, methods, and/or operational flowcharts disclosed in this document. Herein, the processor 202*b* and the memory 204*b* may be a part of a communication modem/circuit/chip designed to implement RAT (e.g., LTE or NR). The transceiver 206*b* may be connected to the processor 202*b* and transmit and/or receive radio signals through one or more antennas 208*b*. The transceiver 206*b* may include a transmitter and/or a receiver. The transceiver 206*b* may be interchangeably used with an RF unit. In the present disclosure, the wireless device may represent a communication modem/circuit/chip.

Hereinafter, hardware elements of the wireless devices 200*a* and 200*b* will be described more specifically. One or more protocol layers may be implemented by, without being limited to, one or more processors 202*a* and 202*b*. For example, the one or more processors 202*a* and 202*b* may implement one or more layers (e.g., functional layers such as PHY, MAC, RLC, PDCP, RRC, and SDAP). The one or more processors 202*a* and 202*b* may generate one or more Protocol Data Units (PDUs) and/or one or more Service Data Unit (SDUs) according to the descriptions, functions, procedures, proposals, methods, and/or operational flowcharts disclosed in this document. The one or more processors 202*a* and 202*b* may generate messages, control information, data, or information according to the descriptions, functions, procedures, proposals, methods, and/or operational flowcharts disclosed in this document. The one or more processors 202*a* and 202*b* may generate signals (e.g., baseband signals) including PDUs, SDUs, messages, control information, data, or information according to the descriptions, functions, procedures, proposals, methods, and/or operational flowcharts disclosed in this document and provide the generated signals to the one or more transceivers 206*a* and 206*b*. The one or more processors 202*a* and 202*b* may receive the signals (e.g., baseband signals) from the one or more transceivers 206*a* and 206*b* and acquire the PDUs, SDUs, messages, control information, data, or information according to the descriptions, functions, procedures, proposals, methods, and/or operational flowcharts disclosed in this document.

The one or more processors 202*a* and 202*b* may be referred to as controllers, microcontrollers, microprocessors, or microcomputers. The one or more processors 202*a* and 202*b* may be implemented by hardware, firmware, software, or a combination thereof. For example, one or more Application Specific Integrated Circuits (ASICs), one or more Digital Signal Processors (DSPs), one or more Digital Signal Processing Devices (DSPDs), one or more Programmable Logic Devices (PLDs), or one or more Field Programmable Gate Arrays (FPGAs) may be included in the one or more processors 202*a* and 202*b*. The descriptions, functions, procedures, proposals, methods, and/or operational flowcharts disclosed in this document may be implemented using firmware or software and the firmware or software may be configured to include the modules, procedures, or functions. Firmware or software configured to perform the descriptions, functions, procedures, proposals, methods, and/or operational flowcharts disclosed in this document may be included in the one or more processors 202*a* and 202*b* or stored in the one or more memories 204*a* and 204*b* so as to be driven by the one or more processors 202*a* and 202*b*. The descriptions, functions, procedures, proposals, methods, and/or operational flowcharts disclosed in this document may be implemented using firmware or software in the form of code, commands, and/or a set of commands.

The one or more memories 204*a* and 204*b* may be connected to the one or more processors 202*a* and 202*b* and store various types of data, signals, messages, information, programs, code, instructions, and/or commands. The one or more memories 204*a* and 204*b* may be configured by Read-Only Memories (ROMs), Random Access Memories (RAMs), Electrically Erasable Programmable Read-Only Memories (EPROMs), flash memories, hard drives, registers, cash memories, computer-readable storage media, and/or combinations thereof. The one or more memories 204*a* and 204*b* may be located at the interior and/or exterior of the one or more processors 202*a* and 202*b*. In addition, the one or more memories 204*a* and 204*b* may be connected to the one or more processors 202*a* and 202*b* through various technologies such as wired or wireless connection.

The one or more transceivers 206*a* and 206*b* may transmit user data, control information, and/or radio signals/channels, mentioned in the methods and/or operational flowcharts of this document, to one or more other devices. The one or more transceivers 206*a* and 206*b* may receive user data, control information, and/or radio signals/channels, mentioned in the descriptions, functions, procedures, proposals, methods, and/or operational flowcharts disclosed in this document, from one or more other devices. For example, the one or more transceivers 206*a* and 206*b* may be connected to the one or more processors 202*a* and 202*b* and transmit and receive radio signals. For example, the one or more processors 202*a* and 202*b* may perform control so that the one or more transceivers 206*a* and 206*b* may transmit user data, control information, or radio signals to one or more other devices. In addition, the one or more processors 202*a* and 202*b* may perform control so that the one or more transceivers 206*a* and 206*b* may receive user data, control information, or radio signals from one or more other devices. In addition, the one or more transceivers 206*a* and 206*b* may be connected to the one or more antennas 208*a* and 208*b* and the one or more transceivers 206*a* and 206*b* may be configured to transmit and receive user data, control information, and/or radio signals/channels, mentioned in the descriptions, functions, procedures, proposals, methods, and/or operational flowcharts disclosed in this document, through the one or more antennas 208*a* and 208*b*. In this document, the one or more antennas may be a plurality of physical antennas or a plurality of logical antennas (e.g., antenna ports). The one or more transceivers 206*a* and 206*b* may convert received radio signals/channels etc. from RF band signals into baseband signals in order to process received user data, control information, radio signals/channels, etc. using the one or more processors 202*a* and 202*b*. The one or more transceivers 206*a* and 206*b* may convert the user data, control information, radio signals/channels, etc. processed using the one or more processors 202*a* and 202*b* from the base band signals into the RF band signals. To this end, the one or more transceivers 206*a* and 206*b* may include (analog) oscillators and/or filters.

Hereinafter, a wireless device structure applicable to the present disclosure will be described.

Figure 3:
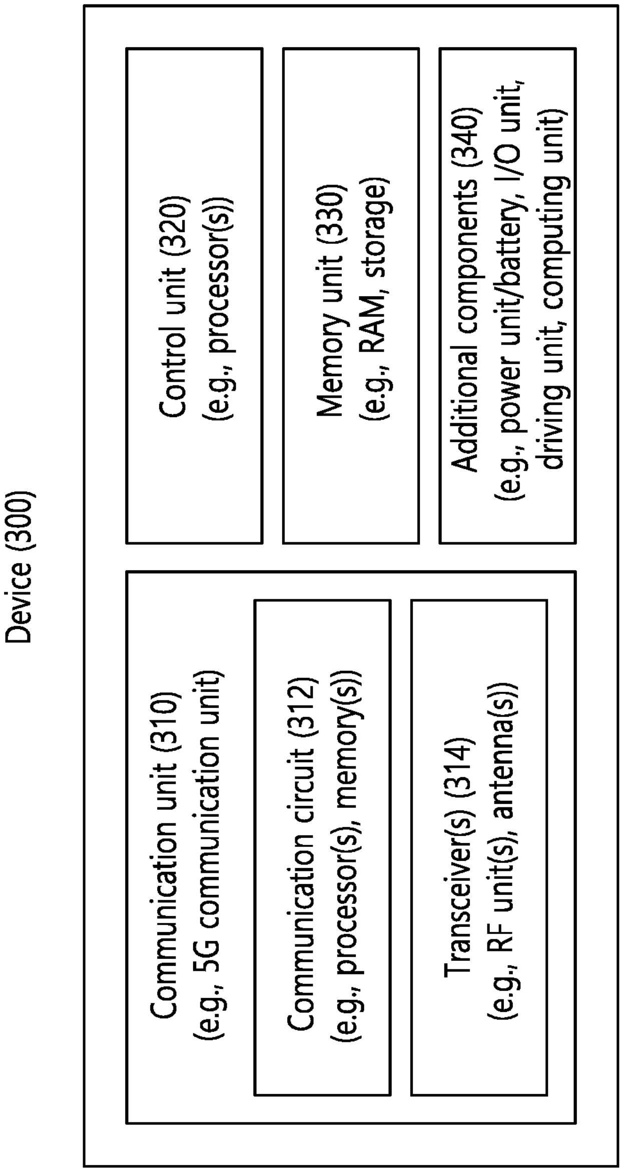
FIG. 3 is a diagram illustrating another example of a wireless device applicable to the present disclosure.

FIG. 3 shows another example of a wireless device applied to the present disclosure.

Referring to FIG. 3, wireless devices 300 may correspond to the wireless devices 200*a*, 200*b* of FIG. 2 and may be configured by various elements, components, units/portions, and/or modules. For example, each of the wireless devices 300 may include a communication unit 310, a control unit 320, a memory unit 330, and additional components 340. The communication unit may include a communication circuit 312 and transceiver(s) 314. For example, the communication circuit 312 may include the one or more processors 202*a*, 202*b* and/or the one or more memories 204*a*, 204*b* of FIG. 2. For example, the transceiver(s) 314 may include the one or more transceivers 206*a*, 206*b* and/or the one or more antennas 208*a*, 208*b* of FIG. 2. The control unit 320 is electrically connected to the communication unit 310, the memory 330, and the additional components 340 and controls overall operation of the wireless devices. For example, the control unit 320 may control an electric/mechanical operation of the wireless device based on programs/code/instructions/information stored in the memory unit 330. The control unit 320 may transmit the information stored in the memory unit 330 to the exterior (e.g., other communication devices) via the communication unit 310 through a wireless/wired interface or store, in the memory unit 330, information received through the wireless/wired interface from the exterior (e.g., other communication devices) via the communication unit 310.

The additional components 340 may be variously configured according to types of wireless devices. For example, the additional components 340 may include at least one of a power unit/battery, input/output (I/O) unit, a driving unit, and a computing unit. The wireless device 300 may be implemented in the form of, without being limited to, the robot (100*a* of FIG. 1), the vehicles (100*b*-1, 100*b*-2 of FIG. 1), the XR device (100*c* of FIG. 1), the hand-held device (100*d* of FIG. 1), the home appliance (100*e* of FIG. 1), the IoT device (100*f* of FIG. 1), a digital broadcast UE, a hologram device, a public safety device, an MTC device, a medicine device, a fintech device (or a finance device), a security device, a climate/environment device, the AI server/device (140 of FIG. 1), the BSs (120 of FIG. 1), a network node, and so on. The wireless device may be used in a mobile or fixed place according to a usage-example/service.

In FIG. 3, the entirety of the various elements, components, units/portions, and/or modules in the wireless devices 300 may be connected to each other through a wired interface or at least a part thereof may be wirelessly connected through the communication unit 310. For example, in each of the wireless devices 300, the control unit 320 and the communication unit 310 may be connected by wire and the control unit 320 and first units (e.g., 130, 140) may be wirelessly connected through the communication unit 310. Each element, component, unit/portion, and/or module within the wireless devices 300 may further include one or more elements. For example, the control unit 320 may be configured by a set of one or more processors. As an example, the control unit 320 may be configured by a set of a communication control processor, an application processor, an Electronic Control Unit (ECU), a graphical processing unit, and a memory control processor. As another example, the memory 330 may be configured by a Random Access Memory (RAM), a Dynamic RAM (DRAM), a Read Only Memory (ROM)), a flash memory, a volatile memory, a non-volatile memory, and/or a combination thereof.

Hereinafter, a portable device applicable to the present disclosure will be described.

Figure 4:
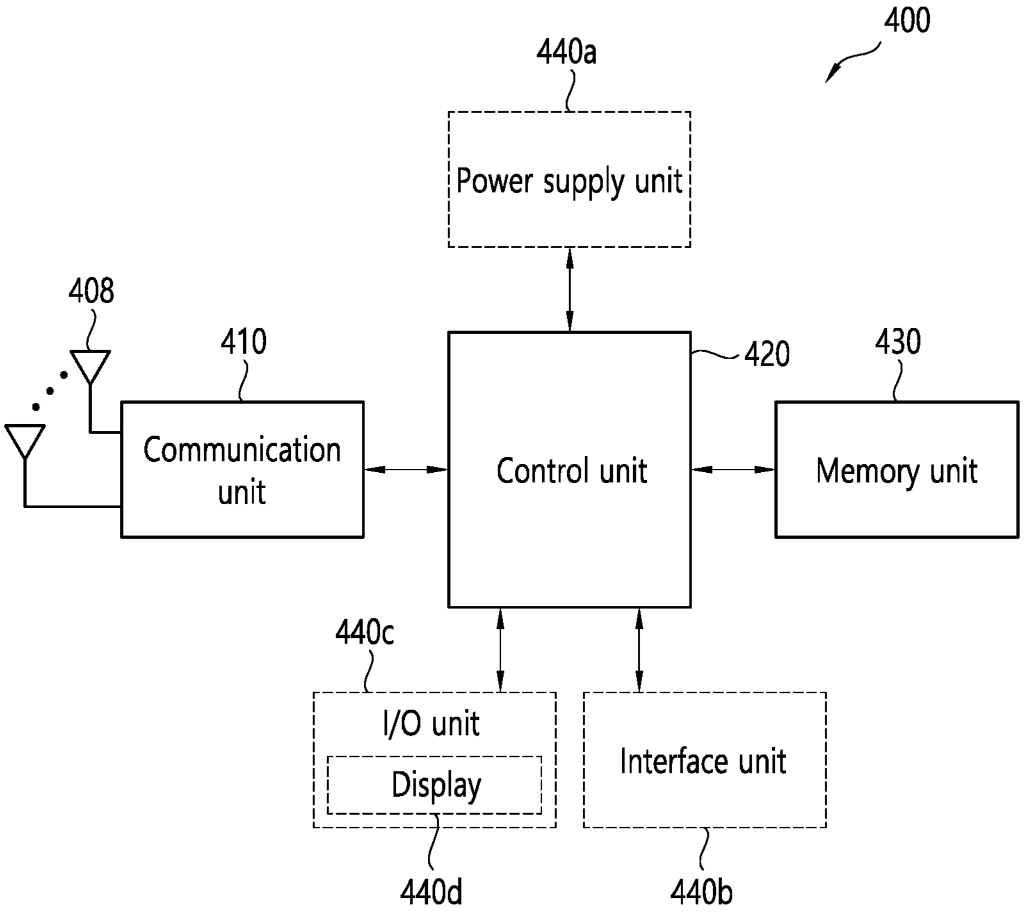
FIG. 4 is a diagram illustrating an example of a portable device applicable to the present disclosure.

FIG. 4 is a diagram illustrating an example of a portable device applied to the present disclosure.

FIG. 4 illustrates a portable device applied to the present disclosure. The portable device may include a smartphone, a smart pad, a wearable device (e.g., smart watch or smart glasses), a portable computer (e.g., a notebook), etc. The portable device may be referred to as a mobile station (MS), a user terminal (UT), a mobile subscriber station (MSS), a subscriber station (SS), an advanced mobile station (AMS), or a wireless terminal (WT).

Referring to FIG. 4, the portable device 400 may include an antenna unit 408, a communication unit 410, a controller 420, a memory unit 430, a power supply unit 440*a*, an interface unit 440*b*, and input/output unit 440*c*. The antenna unit 408 may be configured as a part of the communication unit 410. Blocks 410 to 430/440*a* to 440*c* correspond to blocks 310 to 330/340 of FIG. 3, respectively.

The communication unit 410 may transmit and receive signals (e.g., data, control signals, etc.) with other wireless devices and BSs. The controller 420 may perform various operations by controlling components of the portable device 400. The controller 420 may include an application processor (AP). The memory unit 430 may store data/parameters/programs/codes/commands required for driving the portable device 400. Also, the memory unit 430 may store input/output data/information, and the like. The power supply unit 440*a* supplies power to the portable device 400 and may include a wired/wireless charging circuit, a battery, and the like. The interface unit 440*b* may support connection between the portable device 400 and other external devices. The interface unit 440*b* may include various ports (e.g., audio input/output ports or video input/output ports) for connection with external devices. The input/output unit 440*c* may receive or output image information/signal, audio information/signal, data, and/or information input from a user. The input/output unit 440*c* may include a camera, a microphone, a user input unit, a display unit 440*d*, a speaker, and/or a haptic module.

For example, in the case of data communication, the input/output unit 440*c* acquires information/signals (e.g., touch, text, voice, image, or video) input from the user, and the acquired information/signals may be stored in the memory unit 430. The communication unit 410 may convert information/signals stored in the memory into wireless signals and may directly transmit the converted wireless signals to other wireless devices or to a BS. In addition, after receiving a wireless signal from another wireless device or a BS, the communication unit 410 may restore the received wireless signal to the original information/signal. The restored information/signal may be stored in the memory unit 430 and then output in various forms (e.g., text, voice, image, video, or haptic) through the input/output unit 440*c*.

Hereinafter, types of wireless devices applicable to the present disclosure will be described.

Figure 5:
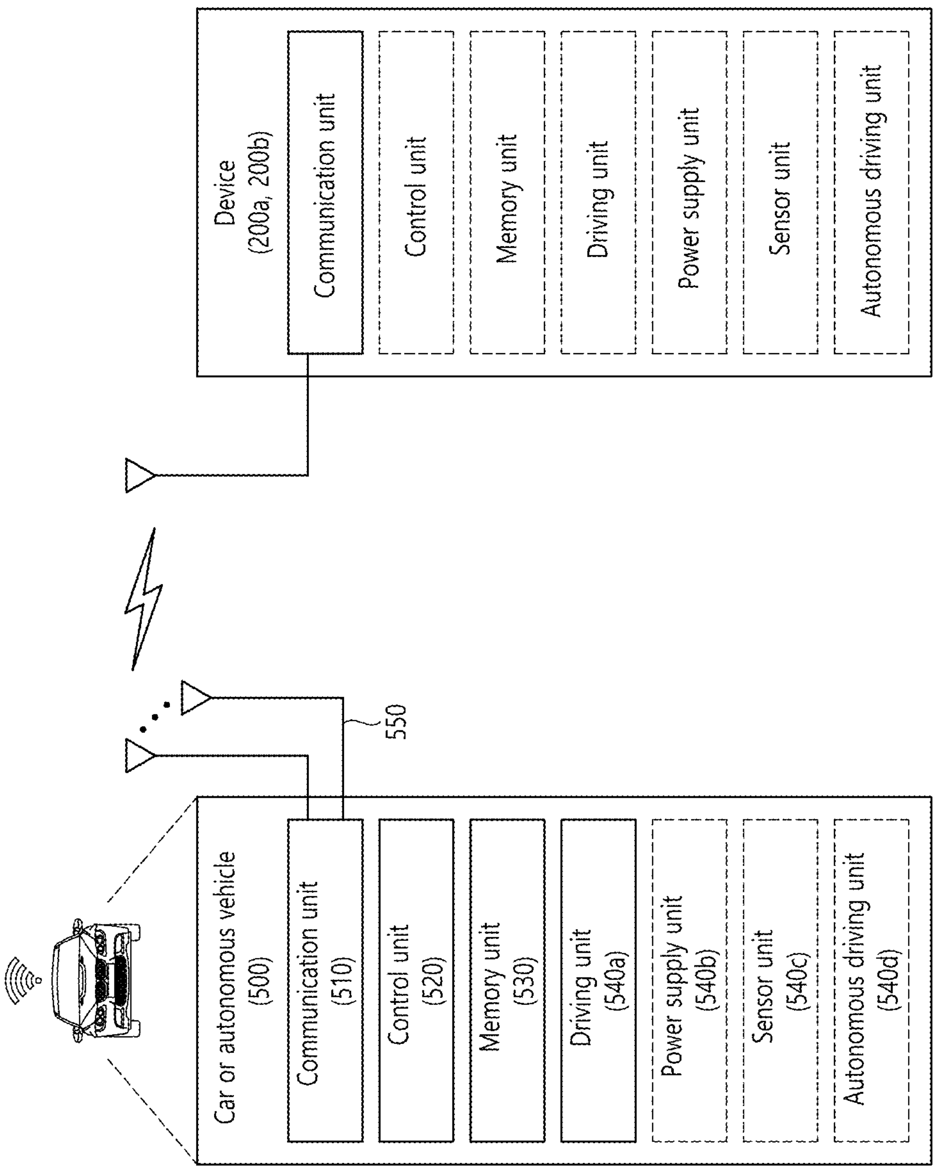
FIG. 5 is a diagram illustrating an example of a vehicle or autonomous vehicle applicable to the present disclosure.

FIG. 5 is a diagram illustrating an example of a vehicle or autonomous vehicle to which the present disclosure applies.

FIG. 5 illustrates a vehicle or an autonomous vehicle applied to the present disclosure. A vehicle or an autonomous vehicle may be implemented as a moving robot, a vehicle, a train, an aerial vehicle (AV), a ship, or the like.

Referring to FIG. 5, a vehicle or autonomous vehicle 500 includes an antenna unit 550, a communication unit 510, a control unit 520, a driving unit 540*a*, a power supply unit 540*b*, and a sensor unit 540*c*, and an autonomous driving unit 540*d*. The antenna unit 550 may be configured as a portion of the communication unit 510. Blocks 510/530 correspond to blocks 410/430 of FIG. 4, respectively.

The communication unit 510 may transmit and receive signals (e.g., data, control signals, etc.) with external devices such as other vehicles, base stations (BSs) (e.g. base station, roadside unit, etc.), and servers. The control unit 520 may perform various operations by controlling elements of the vehicle or the autonomous vehicle 500. The control unit 520 may include an electronic control unit (ECU). The driving unit 540*a* may cause the vehicle or the autonomous vehicle 500 to travel on the ground. The driving unit 540*a* may include an engine, a motor, a power train, a wheel, a brake, a steering device, and the like. The power supply unit 540*b* supplies power to the vehicle or the autonomous vehicle 500, and may include a wired/wireless charging circuit, a battery, and the like. The sensor unit 540*c* may obtain vehicle status, surrounding environment information, user information, and the like. The sensor unit 540*c* may include an inertial measurement unit (IMU) sensor, a collision sensor, a wheel sensor, a speed sensor, an inclination sensor, a weight detection sensor, a heading sensor, a position module, a vehicle forward/reverse sensor, a battery sensor, a fuel sensor, a tire sensor, a steering sensor, a temperature sensor, a humidity sensor, an ultrasonic sensor, an illuminance sensor, a pedal position sensor, etc. The autonomous driving unit 540*d* may implement a technology of maintaining a driving lane, a technology of automatically adjusting a speed such as adaptive cruise control, a technology of automatically traveling along a predetermined route, and a technology of automatically setting a route and traveling when a destination is set.

For example, the communication unit 510 may receive map data, traffic information data, and the like from an external server. The autonomous driving unit 540*d* may generate an autonomous driving route and a driving plan based on the acquired data. The control unit 520 may control the driving unit 540*a* so that the vehicle or the autonomous vehicle 500 moves along the autonomous driving route according to the driving plan (e.g., speed/direction adjustment). During autonomous driving, the communication unit 510 may asynchronously/periodically acquire the latest traffic information data from an external server and may acquire surrounding traffic information data from surrounding vehicles. In addition, during autonomous driving, the sensor unit 540*c* may acquire vehicle state and surrounding environment information. The autonomous driving unit 540*d* may update the autonomous driving route and the driving plan based on newly acquired data/information. The communication unit 510 may transmit information on a vehicle location, an autonomous driving route, a driving plan, and the like to the external server. The external server may predict traffic information data in advance using AI technology or the like based on information collected from the vehicle or autonomous vehicles and may provide the predicted traffic information data to the vehicle or autonomous vehicles.

Figure 6:
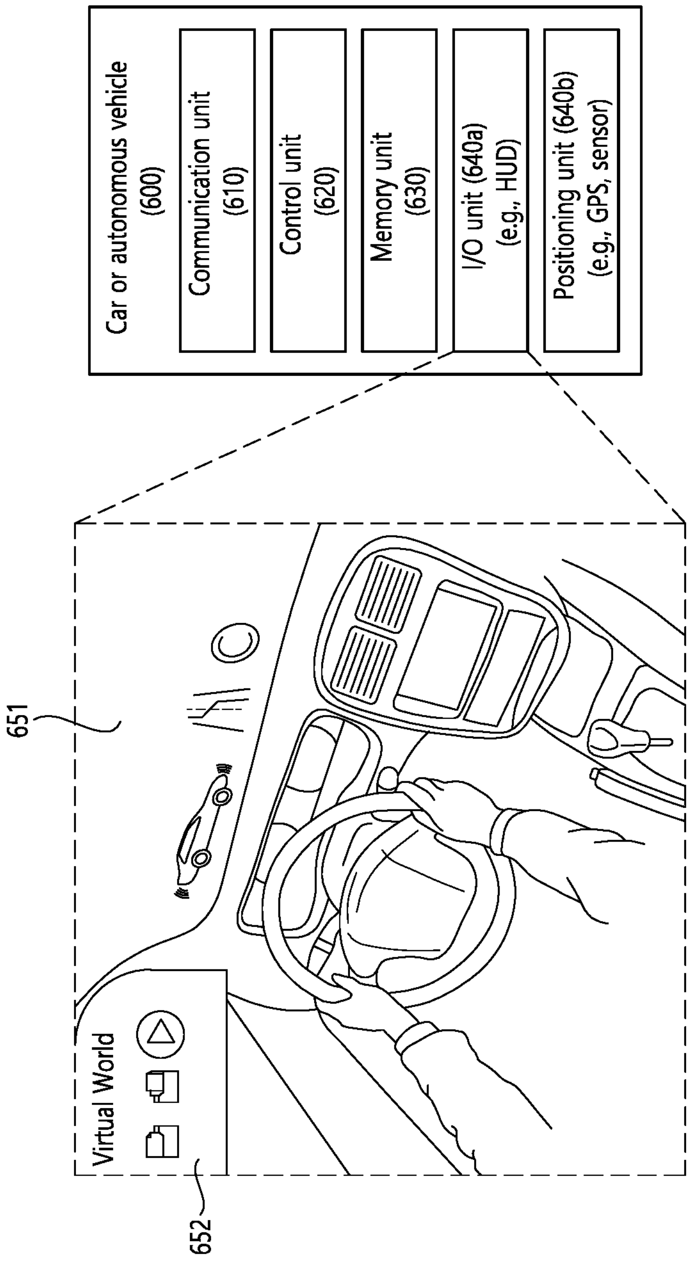
FIG. 6 is a diagram showing an example of a moving body applicable to the present disclosure.

FIG. 6 is a diagram showing an example of a moving body applied to the present disclosure.

Referring to FIG. 6, a mobile body applied to the present disclosure may be implemented as at least one of a vehicle, a train, an air vehicle, and a ship. In addition, the mobile body applied to the present disclosure may be implemented in other forms, and is not limited to the above-described embodiment.

Referring to FIG. 6, the mobile body 600 may include a communication unit 610, a control unit 620, a memory unit 630, an input/output unit 640*a*, and a position measurement unit 640*b*. Here, blocks 610 to 630/640*a* to 640*b* correspond to blocks 310 to 330/340 of FIG. 3, respectively.

The communication unit 610 may transmit and receive signals (e.g., data, control signals, etc.) with other vehicles or external devices such as a BS. The control unit 620 may perform various operations by controlling components of the mobile body 600. The memory unit 630 may store data/parameters/programs/codes/commands supporting various functions of the mobile body 600. The input/output unit 640*a* may output an AR/VR object based on information in the memory unit 630. The input/output unit 640*a* may include a HUD. The location measurement unit 640*b* may acquire location information of the mobile body 600. The location information may include absolute location information of the mobile body 600, location information within a driving line, acceleration information, location information with surrounding vehicles, and the like. The location measurement unit 6140*b* may include a GPS and various sensors.

For example, the communication unit 610 of the mobile body 600 may receive map information, traffic information, etc., from an external server and store the information in the memory unit 630. The location measurement unit 640*b* may acquire vehicle location information through GPS and various sensors and store the vehicle location information in the memory unit 630. The control unit 620 may generate a virtual object based the on map information, the traffic information, the vehicle location information, and the like, and the input/output unit 640*a* may display the generated virtual object on a window of the mobile body 651, 652. In addition, the control unit 620 may determine whether the mobile body 600 is operating normally within a driving line based on vehicle location information. When the mobile body 600 deviates from the driving line abnormally, the control unit 620 may display a warning on a windshield of the vehicle through the input/output unit 640*a*. In addition, the control unit 620 may broadcast a warning message regarding a driving abnormality to nearby vehicles through the communication unit 610. Depending on a situation, the control unit 620 may transmit location information of the vehicle and information on driving/vehicle abnormalities to related organizations through the communication unit 610.

Figure 7:
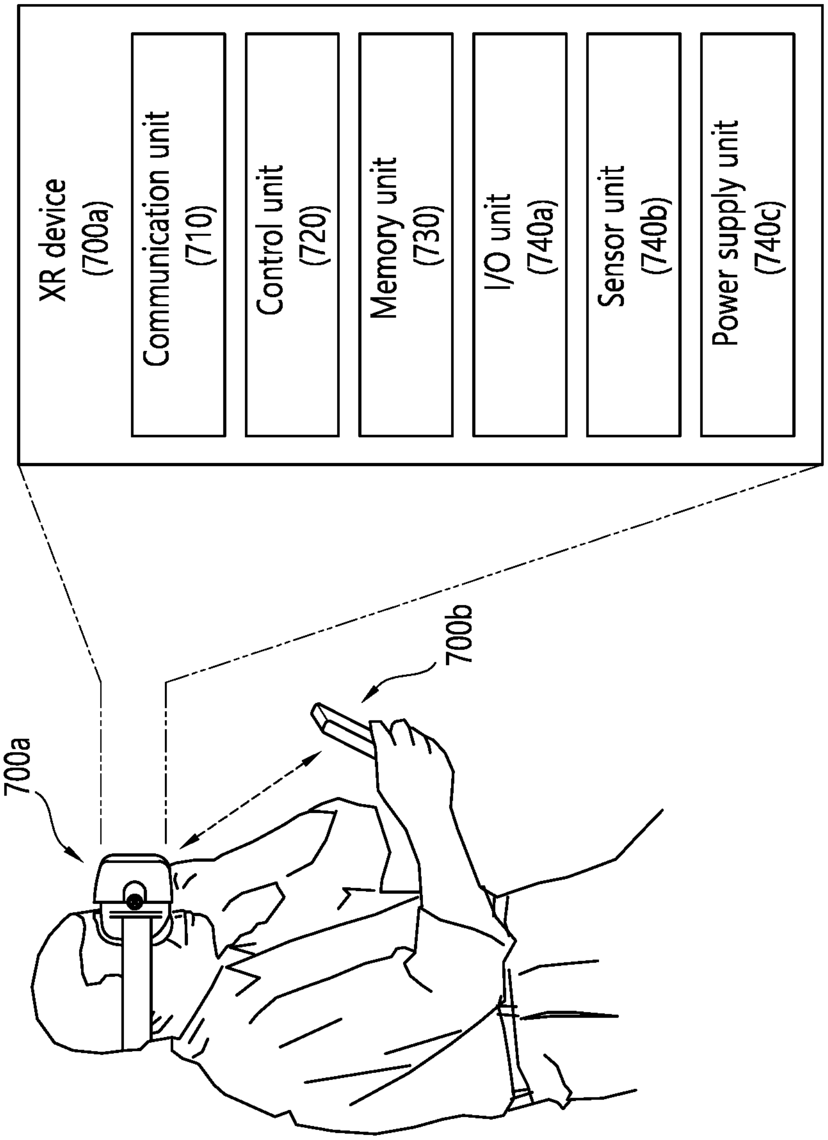
FIG. 7 is a diagram showing an example of an XR device applicable to the present disclosure.

FIG. 7 illustrates an XR device applied to the present disclosure. The XR device may be implemented as an HMD, a head-up display (HUD) provided in a vehicle, a television, a smartphone, a computer, a wearable device, a home appliance, a digital signage, a vehicle, a robot, and the like.

Referring to FIG. 7, the XR device 700*a* may include a communication unit 710, a control unit 720, a memory unit 730, an input/output unit 740*a*, a sensor unit 740*b*, and a power supply unit 740*c*. Here, blocks 710 to 730/740*a* to 740*c* correspond to blocks 310 to 330/340 of FIG. 3, respectively.

The communication unit 710 may transmit and receive signals (e.g., media data, control signals, etc.) with external devices such as other wireless devices, portable devices, media servers. Media data may include images, sounds, and the like. The control unit 720 may perform various operations by controlling components of the XR device 700*a*. For example, the control unit 720 may be configured to control and/or perform procedures such as video/image acquisition, (video/image) encoding, and metadata generating and processing. The memory unit 730 may store data/parameters/programs/codes/commands required for driving the XR device 700*a*/generating an XR object.

The input/output unit 740*a* may obtain control information, data, etc. from the outside and may output the generated XR object. The input/output unit 740*a* may include a camera, a microphone, a user input unit, a display unit, a speaker, and/or a haptic module. The sensor unit 740*b* may obtain XR device status, surrounding environment information, user information, and the like. The sensor unit 740*b* may include a proximity sensor, an illuminance sensor, an acceleration sensor, a magnetic sensor, a gyro sensor, an inertial sensor, an RGB sensor, an IR sensor, a fingerprint recognition sensor, an ultrasonic sensor, an optical sensor, a microphone, and/or a radar. The power supply unit 740*c* may supply power to the XR device 700*a* and may include a wired/wireless charging circuit, a battery, and the like.

As an example, the memory unit 730 of the XR device 700*a* may include information (e.g., data, etc.) necessary for generating an XR object (e.g., AR/VR/MR object). The input/output unit 740*a* may acquire a command to manipulate the XR device 700*a* from a user, and the control unit 720 may drive the XR device 700*a* according to the user's driving command. For example, when the user tries to watch a movie, news, etc., through the XR device 700*a*, the control unit 720 may transmit content request information through the communication unit 730 to another device (for example, the portable device 700*b*) or to a media server. The communication unit 730 may download/stream content such as movies and news from another device (e.g., the portable device 700*b*) or the media server to the memory unit 730. The control unit 720 may control and/or perform procedures such as video/image acquisition, (video/image) encoding, and metadata generating/processing for the content, and generate/output an XR object based on information on a surrounding space or a real object through the input/output unit 740*a*/sensor unit 740*b*.

In addition, the XR device 700*a* may be wirelessly connected to the portable device 700*b* through the communication unit 710, and an operation of the XR device 700*a* may be controlled by the portable device 700*b*. For example, the portable device 700*b* may operate as a controller for the XR device 700*a*. To this end, the XR device 700*a* may acquire 3D location information of the portable device 700*b*, generate an XR entity corresponding to the portable device 700*b*, and output the generated XR entity.

Figure 8:
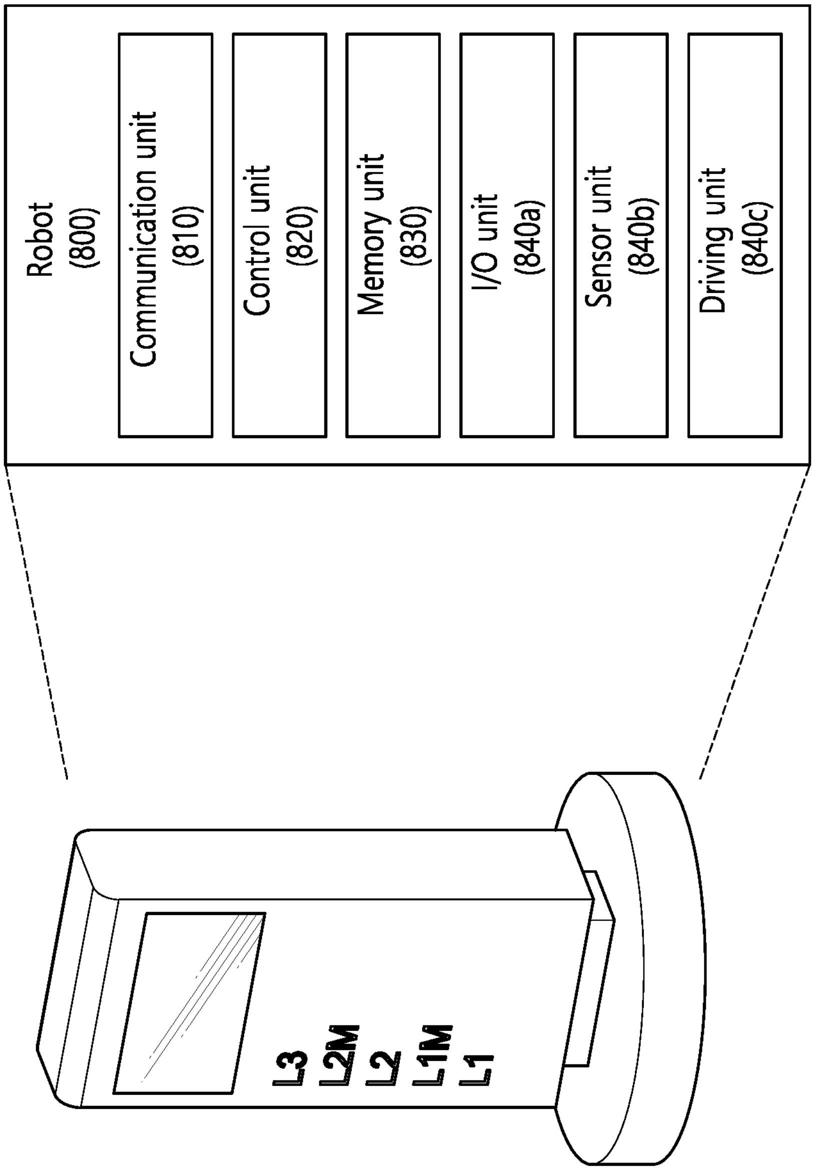
FIG. 8 is a diagram showing an example of a robot applicable to the present disclosure.

FIG. 8 illustrates a robot applied to the present disclosure. For example, robots may be classified as industrial, medical, household, military, etc. depending on the purpose or field of use. Here, referring to FIG. 8, a robot 800 may include a communication unit 810, a control unit 820, a memory unit 830, an input/output unit 840*a*, a sensor unit 840*b*, and a driving unit 840*c*. Here, blocks 810 to 830/840*a* to 840*d* correspond to blocks 310 to 330/340 of FIG. 3, respectively.

The communication unit 810 may transmit and receive signals (e.g., driving information, control signals, etc.) with other wireless devices, other robots, or external devices such as a control server. The control unit 820 may perform various operations by controlling components of the robot 800. The memory unit 830 may store data/parameters/programs/codes/commands supporting various functions of the robot 800. The input/output unit 840*a* may acquire information from the outside of the robot 800 and may output the information to the outside of the robot 800. The input/output unit 840*a* may include a camera, a microphone, a user input unit, a display unit, a speaker, and/or a haptic module.

The sensor unit 840*b* may obtain internal information, surrounding environment information, user information, and the like of the robot 800. The sensor unit 840*b* may include a proximity sensor, an illuminance sensor, an acceleration sensor, a magnetic sensor, a gyro sensor, an inertial sensor, an IR sensor, a fingerprint recognition sensor, an ultrasonic sensor, an optical sensor, a microphone, a radar, and the like.

The driving unit 840*c* may perform various physical operations such as moving a robot joint. In addition, the driving unit 840*c* may cause the robot 800 to travel on the ground or fly in the air. The driving unit 840*c* may include an actuator, a motor, a wheel, a brake, a propeller, and the like.

Figure 9:
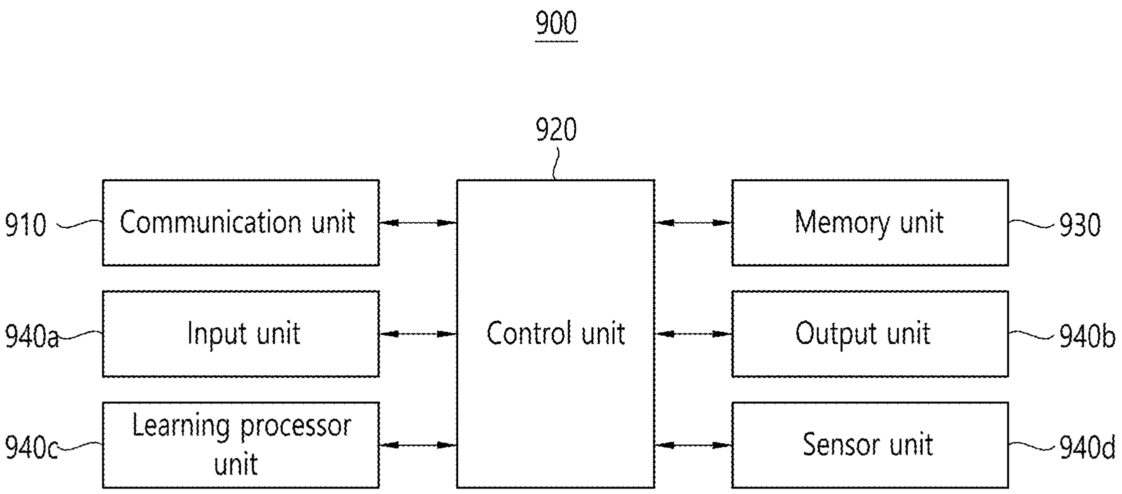
FIG. 9 is a diagram showing an example of AI (Artificial Intelligence) applicable to the present disclosure.

FIG. 9 illustrates an AI device applied to the present disclosure. AI devices may be implemented as fixed devices or moving devices such as TVs, projectors, smartphones, PCs, notebooks, digital broadcasting UEs, tablet PCs, wearable devices, set-top boxes (STBs), radios, washing machines, refrigerators, digital signage, robots, vehicles, etc.

Referring to FIG. 9, the AI device 900 may include a communication unit 910, a control unit 920, a memory unit 930, an input/output unit 940*a*/940*b*, a learning processor unit 940*c*, and a sensor unit 940*d*. Blocks 910 to 930/940*a* to 940*d* correspond to blocks 310 to 330/340 of FIG. 3, respectively.

The communication unit 910 may transmit and receive wireless signals (e.g., sensor information, user input, learning model, control signals, etc.) with external devices such as another AI device (e.g., FIG. 1, 100*f*, 120, or 140) or an AI server (e.g., 140 in FIG. 1) using wired/wireless communication technology. To this end, the communication unit 910 may transmit information in the memory unit 930 to an external device or may transfer a signal received from the external device to the memory unit 930.

The control unit 920 may determine at least one executable operation of the AI device 900 based on information determined or generated using a data analysis algorithm or a machine learning algorithm. In addition, the control unit 920 may perform a determined operation by controlling the components of the AI device 900. For example, the control unit 920 may request, search, receive, or utilize data from the learning processor unit 940*c* or the memory unit 930, and may control components of the AI device 900 to execute a predicted operation among at least one an executable operation or an operation determined to be desirable. In addition, the control unit 920 may collect history information including operation content of the AI device 900 or the user's feedback on the operation, and store the collected information in the memory unit 930 or the learning processor unit

940*c* or transmit the information to an external device such as an AI server. The collected historical information may be used to update a learning model.

The memory unit 930 may store data supporting various functions of the AI device 900. For example, the memory unit 930 may store data obtained from the input unit 940*a*, data obtained from the communication unit 910, output data from the learning processor unit 940*c*, and data obtained from the sensing unit 940. In addition, the memory unit 930 may store control information and/or software codes necessary for the operation/execution of the control unit 920.

The input unit 940*a* may acquire various types of data from the outside of the AI device 900. For example, the input unit 940*a* may acquire training data for model training and input data to which the training model is applied. The input unit 940*a* may include a camera, a microphone, and/or a user input unit. The output unit 940*b* may generate output related to visual, auditory, or tactile sense. The output unit 940*b* may include a display unit, a speaker, and/or a haptic module. The sensing unit 940 may obtain at least one of internal information of the AI device 900, surrounding environment information of the AI device 900, and user information by using various sensors. The sensing unit 940 may include a proximity sensor, an illuminance sensor, an acceleration sensor, a magnetic sensor, a gyro sensor, an inertial sensor, an RGB sensor, an IR sensor, a fingerprint recognition sensor, an ultrasonic sensor, an optical sensor, a microphone, and/or a radar.

The learning processor unit 940*c* may train a model configured as an artificial neural network using training data. The learning processor unit 940*c* may perform AI processing together with the learning processor unit (140 in FIG. 1) of the AI server. The learning processor unit 940*c* may process information received from an external device through the communication unit 910 and/or information stored in the memory unit 930. In addition, an output value of the learning processor unit 940*c* may be transmitted to an external device through the communication unit 910 and/or may be stored in the memory unit 930.

In below, physical channels and typical signal transmission are described.

In a wireless communication system, a UE may receive information from a BS through a downlink (DL), and the UE may transmit information to the BS through an uplink (UL). The information transmitted/received by the BS and the UE includes general data information and a variety of control information, and there are various physical channels according to a type/purpose of the information transmitted/received by the BS and the UE.

Figure 10:
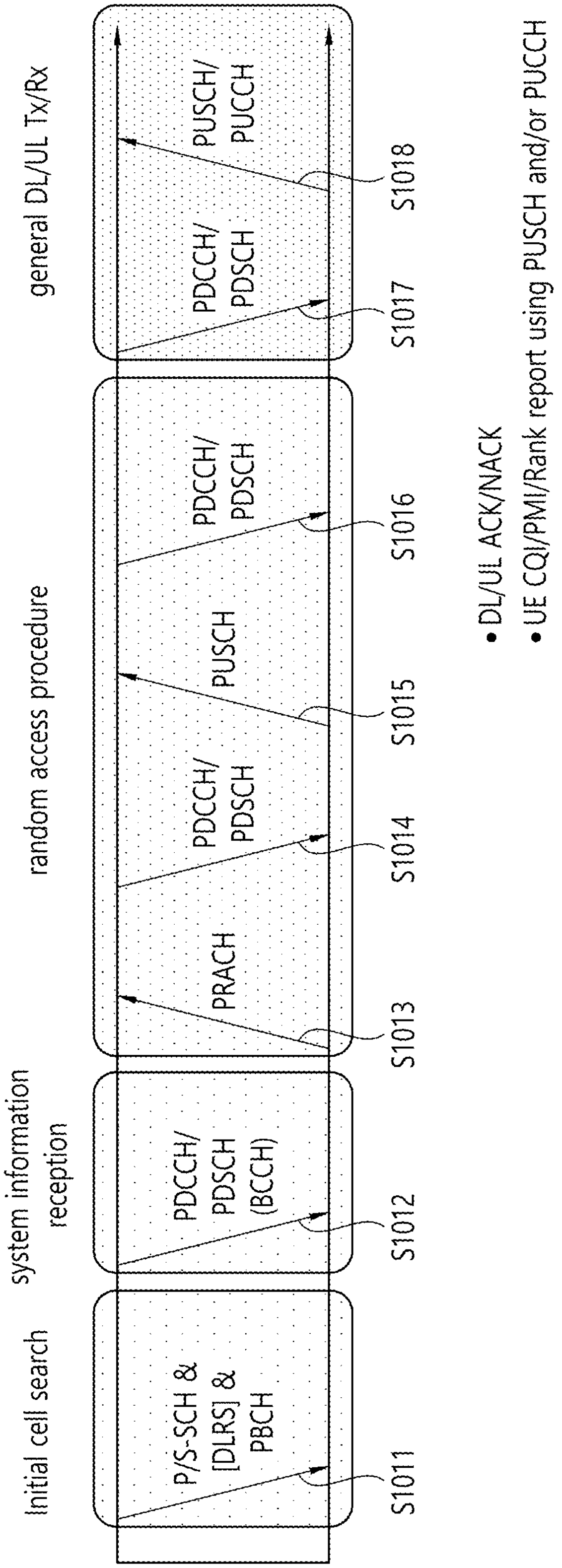
FIG. 10 is a diagram illustrating physical channels applicable to the present disclosure and a signal transmission method using them.

FIG. 10 is a diagram illustrating physical channels applied to the present disclosure and a signal transmission method using them.

The UE which is powered on again in a power-off state or which newly enters a cell performs an initial cell search operation such as adjusting synchronization with the BS or the like (S1011). To this end, the UE receives a primary synchronization channel (P-SCH) and a secondary synchronization channel (S-SCH) from the BS to adjust synchronization with the BS, and acquire information such as a cell identity (ID) or the like.

After that, the UE may receive a physical broadcast channel (PBCH) from the BS to acquire broadcasting information in the cell. In addition, the UE may receive a downlink reference signal (DL RS) in an initial cell search step to identify a downlink channel state. Upon completing the initial cell search, the UE may receive a physical downlink control channel (PDCCH) and a physical downlink control channel (PDSCH) corresponding thereto to acquire more specific system information (S1012).

Thereafter, the UE may perform a random access procedure to complete an access to the BS (S1013~S1016). For this, the UE may transmit a preamble through a physical random access channel (PRACH) (S1013), and may receive a random access response (RAR) for the preamble through a PDCCH and a PDSCH corresponding thereto (S1014). Thereafter, the UE may transmit a physical uplink shared channel (PUSCH) by using scheduling information in the RAR (S1015), and a contention resolution procedure such as receiving a physical downlink control channel signal and a corresponding physical downlink shared channel signal may be performed (S1016).

After performing the aforementioned procedure, the UE may perform PDCCH and/or PDSCH reception (S1017) and PUSCH and/or physical uplink control channel (PUCCH) transmission (S1018) as a typical uplink/downlink signal transmission procedure.

Control information transmitted by the UE to the BS is referred to as uplink control information (UCI). The UCI includes hybrid automatic repeat and request (HARQ) acknowledgement (ACK)/negative-ACK (NACK), scheduling request (SR), a channel quality indicator (CQI), a precoding matrix indicator (PMI), a rank indication (RI), a beam indication (BI) or the like. In general, the UCI is transmitted through the PUCCH. Depending on the embodiment (e.g., when control information and traffic data need to be simultaneously transmitted), they can be transmitted through the PUSCH. In addition, the UE may aperiodically transmit the UCI through the PUSCH according to a request/instruction of a network.

Figure 11:
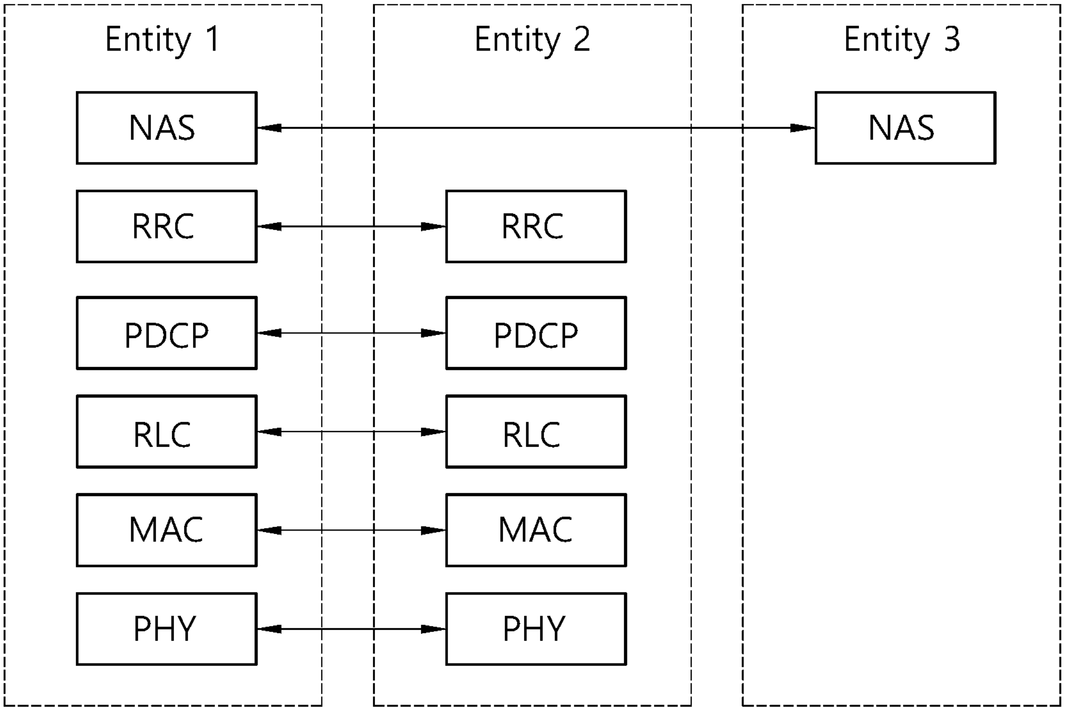
FIG. 11 is a diagram showing structures of a control plane and a user plane of a radio interface protocol applicable to the present disclosure.
Figure 11:
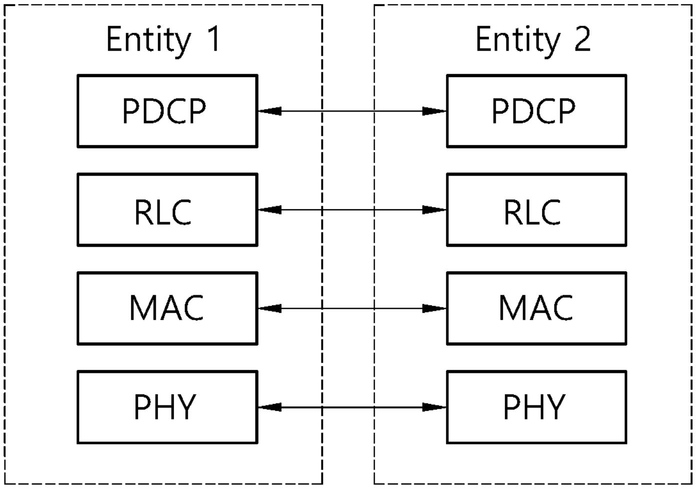

FIG. 11 is a diagram illustrating structures of a control plane and a user plane of a radio interface protocol applied to the present disclosure.

Referring to FIG. 11, entity 1 may be a user equipment (UE). In this case, the UE may be at least one of a wireless device, a portable device, a vehicle, a mobile device, an XR device, a robot, and an AI to which the present disclosure is applied in FIGS. 1 to 9 described above. In addition, a UE refers to a device to which the present disclosure can be applied, and may not be limited to a specific device or device.

Entity 2 may be a base station. In this case, the base station may be at least one of eNB, gNB, and ng-eNB. Also, a base station may refer to a device that transmits a downlink signal to a UE, and may not be limited to a specific type or device. That is, the base station may be implemented in various forms or types, and may not be limited to a specific form.

Entity 3 may be a network device or a device that performs a network function. In this case, the network device may be a core network node (e.g. a mobility management entity (MME), an access and mobility management function (AMF), etc.) that manages mobility. Also, the network function may refer to a function implemented to perform the network function, and entity 3 may be a device to which the function is applied. That is, entity 3 may refer to a function or device that performs a network function, and is not limited to a specific type of device.

The control plane may refer to a path through which control messages used by a user equipment (UE) and a network to manage a call are transmitted. Also, the user plane may refer to a path through which data generated in the application layer, for example, voice data or Internet packet data, is transmitted. In this case, the physical layer, which is the first layer, may provide an information transfer service to an upper layer using a physical channel. The physical layer is connected to the upper medium access control layer through a transport channel. At this time, data may move between the medium access control layer and the physical layer through the transport channel. Data may move between physical layers of a transmitting side and a receiving side through a physical channel. At this time, the physical channel uses time and frequency as radio resources.

A medium access control (MAC) layer of the second layer provides services to a radio link control (RLC) layer, which is an upper layer, through a logical channel. The RLC layer of the second layer may support reliable data transmission. The function of the RLC layer may be implemented as a function block inside the MAC. A packet data convergence protocol (PDCP) layer of the second layer may perform a header compression function that reduces unnecessary control information in order to efficiently transmit IP packets such as IPv4 or IPv6 in a radio interface with a narrow bandwidth. A radio resource control (RRC) layer located at the bottom of the third layer is defined only in the control plane. The RRC layer may be in charge of control of logical channels, transport channels, and physical channels in relation to configuration, re-configuration, and release of radio bearers (RBs). RB may refer to a service provided by the second layer for data transmission between the UE and the network. To this end, the RRC layer of the UE and the network may exchange RRC messages with each other. A non-access stratum (NAS) layer above the RRC layer may perform functions such as session management and mobility management. One cell constituting the base station may be set to one of various bandwidths to provide downlink or uplink transmission services to several UEs. Different cells may be configured to provide different bandwidths. Downlink transport channels for transmitting data from the network to the UE include a broadcast channel (BCH) for transmitting system information, a paging channel (PCH) for transmitting paging messages, and a shared channel (SCH) for transmitting user traffic or control messages. Traffic or control messages of a downlink multicast or broadcast service may be transmitted through a downlink SCH or may be transmitted through a separate downlink multicast channel (MCH). Meanwhile, uplink transport channels for transmitting data from a UE to a network include a random access channel (RACH) for transmitting an initial control message and an uplink shared channel (SCH) for transmitting user traffic or control messages. Logical channels located above the transport channel and mapped to the transport channel include a broadcast control channel (BCCH), a paging control channel (PCCH), a common control channel (CCCH), a multicast control channel (MCCH), and a multicast traffic channel (MTCH). s), etc.

Figure 12:
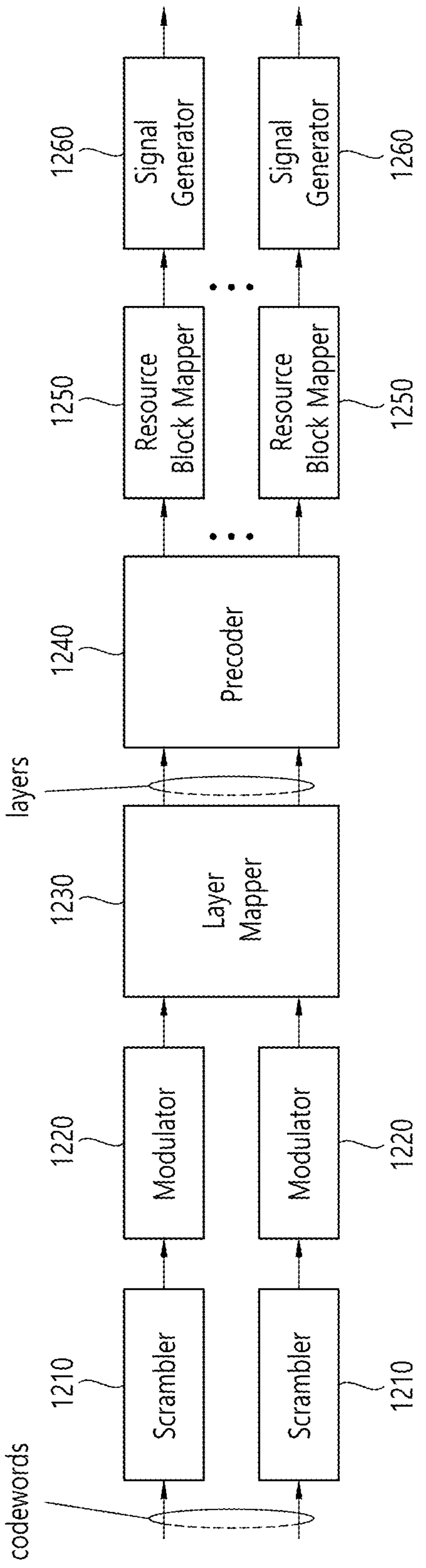
FIG. 12 is a diagram illustrating a method of processing a transmission signal applicable to the present disclosure.

FIG. 12 is a diagram illustrating a method of processing a transmission signal applied to the present disclosure. For example, the transmitted signal may be processed by a signal processing circuit. In this case, the signal processing circuit 1200 may include a scrambler 1210, a modulator 1220, a layer mapper 1230, a precoder 1240, a resource mapper 1250, and a signal generator 1260. At this time, as an example, the operation/function of FIG. 12 may be performed by the processors 202*a* and 202*b* and/or the transceivers 206*a* and 206*b* of FIG. 2. Also, as an example, the hardware elements of FIG. 12 may be implemented in the processors 202*a* and 202*b* and/or the transceivers 206*a* and 206*b* of FIG. 2. As an example, blocks 1010 to 1060 may be implemented in the processors 202*a* and 202*b* of FIG. 2. Also, blocks 1210 to 1250 may be implemented in the processors 202*a* and 202*b* of FIG. 2 and block 1260 may be implemented in the transceivers 206*a* and 206*b* of FIG. 2, and are not limited to the above-described embodiment.

The codeword may be converted into a radio signal through the signal processing circuit 1200 of FIG. 12. Here, a codeword is an encoded bit sequence of an information block. Information blocks may include transport blocks (e.g., UL-SCH transport blocks, DL-SCH transport blocks). The radio signal may be transmitted through various physical channels (e.g., PUSCH, PDSCH) of FIG. 10. Specifically, the codeword may be converted into a scrambled bit sequence by the scrambler 1210. A scramble sequence used for scrambling is generated based on an initialization value, and the initialization value may include ID information of a wireless device. The scrambled bit sequence may be modulated into a modulation symbol sequence by modulator 1220. The modulation method may include pi/2-binary phase shift keying (pi/2-BPSK), m-phase shift keying (m-PSK), m-quadrature amplitude modulation (m-QAM), and the like.

The complex modulation symbol sequence may be mapped to one or more transport layers by the layer mapper 1230. Modulation symbols of each transport layer may be mapped to corresponding antenna port(s) by the precoder 1240 (precoding). The output z of the precoder 1240 can be obtained by multiplying the output y of the layer mapper 1230 by the N*M precoding matrix W. Here, N is the number of antenna ports and M is the number of transport layers. Here, the precoder 1240 may perform precoding after performing transform precoding (e.g., discrete Fourier transform (DFT) transform) on the complex modulation symbols. Also, the precoder 1240 may perform precoding without performing transform precoding.

The resource mapper 1250 may map modulation symbols of each antenna port to time-frequency resources. The time-frequency resource may include a plurality of symbols (e.g., CP-OFDMA symbols and DFT-s-OFDMA symbols) in the time domain and a plurality of subcarriers in the frequency domain. The signal generator 1260 generates a radio signal from the mapped modulation symbols, and the generated radio signal can be transmitted to other devices through each antenna. To this end, the signal generator 1260 may include an inverse fast Fourier transform (IFFT) module, a cyclic prefix (CP) inserter, a digital-to-analog converter (DAC), a frequency uplink converter, and the like.

The signal processing process for the received signal in the wireless device may be configured in reverse to the signal processing process 1210 to 1260 of FIG. 12. For example, a wireless device (e.g., 200*a* and 200*b* of FIG. 2) may receive a wireless signal from the outside through an antenna port/transceiver. The received radio signal may be converted into a baseband signal through a signal restorer. To this end, the signal restorer may include a frequency downlink converter, an analog-to-digital converter (ADC), a CP remover, and a fast Fourier transform (FFT) module. Thereafter, the baseband signal may be restored to a codeword through a resource de-mapper process, a postcoding process, a demodulation process, and a de-scramble process. The codeword may be restored to an original information block through decoding. Accordingly, a signal processing circuit (not shown) for a received signal may include a signal restorer, a resource de-mapper, a postcoder, a demodulator, a de-scrambler, and a decoder.

Figure 13:
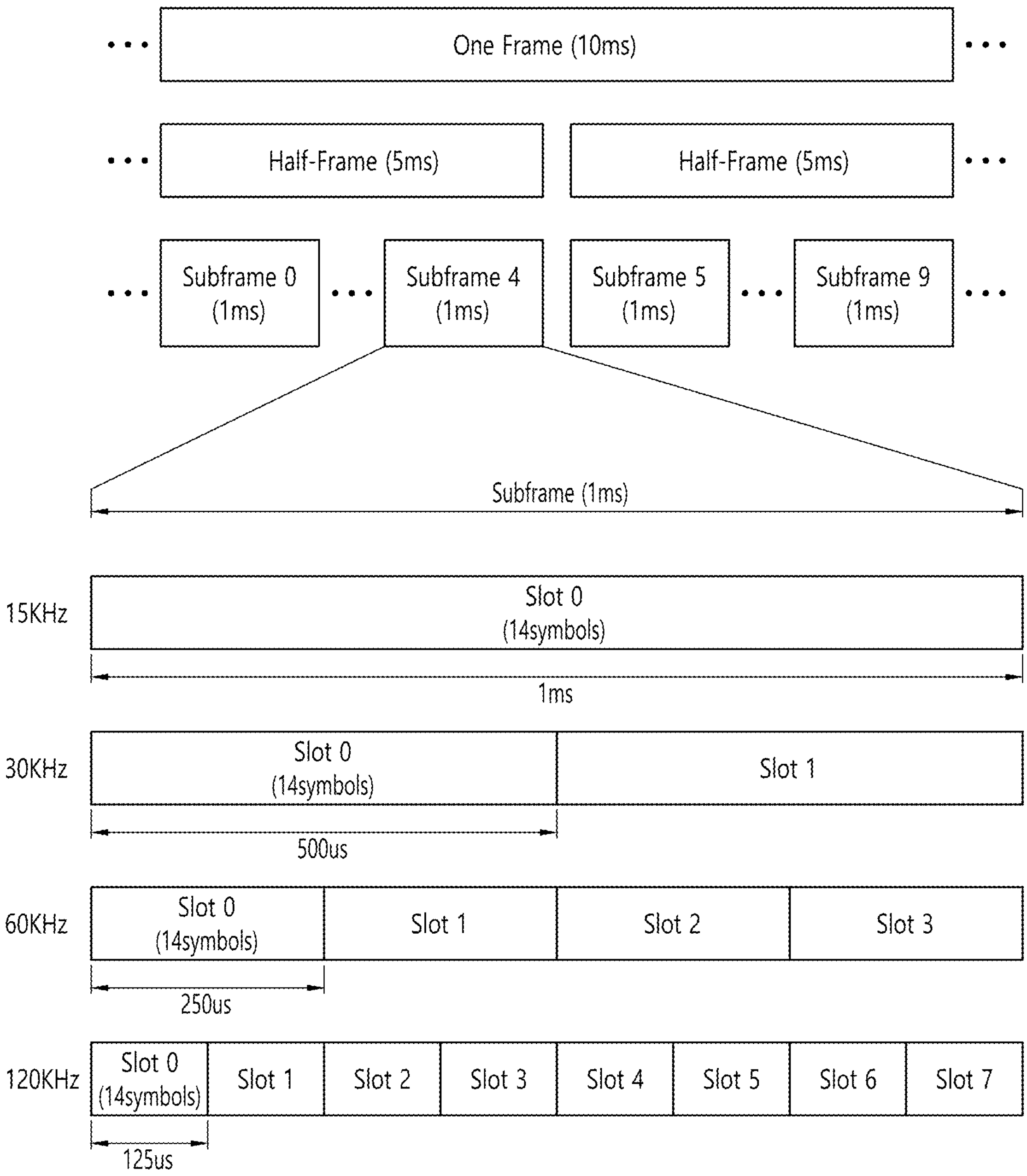
FIG. 13 is a diagram showing the structure of a radio frame applicable to the present disclosure.

FIG. 13 illustrates an example of a frame structure that can be applied to this disclosure.

Uplink and downlink transmission based on the NR system may be based on the frame shown in FIG. 13. At this time, a radio frame has a length of 10 ms and may be defined as two 5 ms half-frames (HF). The HF may be defined as five 1 ms subframes (SFs). The SF may be divided into one or more slots, and the number of slots within the SF depends on a subcarrier spacing (SCS). Each slot includes 12 or 14 OFDM (A) symbols according to a cyclic prefix (CP). In case of using a normal CP, each slot includes 14 symbols. In case of using an extended CP, each slot includes 12 symbols. Herein, a symbol may include an OFDM symbol (or CP-OFDM symbol) and a Single Carrier-FDMA (SC-FDMA) symbol (or Discrete Fourier Transform-spread-OFDM (DFT-s-OFDM) symbol).

Table 1 shows the number of symbols per slot, the number of slots per frame, and the number of slots per subframe according to SCS when a normal CP is used, and Table 2 shows the number of symbols per slot, the number of slots per frame, and the number of slots per subframe according to the SCS when the extended CSP is used.

TABLE 1

| μ | $N_{symb}^{slot}$ | $N_{slot}^{frame,\mu}$ | $N_{slot}^{subframe,\mu}$ |
|---|---|---|---|
| 0 | 14 | 10 | 1 |
| 1 | 14 | 20 | 2 |
| 2 | 14 | 40 | 4 |
| 3 | 14 | 80 | 8 |
| 4 | 14 | 160 | 16 |
| 5 | 14 | 320 | 32 |

TABLE 2

| μ | $N_{symb}^{slot}$ | $N_{slot}^{frame,\mu}$ | $N_{slot}^{subframe,\mu}$ |
|---|---|---|---|
| 2 | 12 | 40 | 4 |

In Tables 1 and 2, $$N_{symb}^{slot}$$

represents the number of symbols in a slot, $$N_{slot}^{frame,\mu}$$

represents the number of slots in a frame, and $$N_{slot}^{subframe,\mu}$$

represents the number of slots in a subframe.

In addition, in a system to which the present disclosure is applicable, OFDM (A) numerology (e.g., SCS, CP length, etc.) may be set differently among a plurality of cells merged into one UE. Accordingly, (absolute time) intervals of time resources (e.g., SFs, slots, or TTIs) (for convenience, collectively referred to as time units (TUs)) composed of the same number of symbols may be set differently between merged cells.

NR supports multiple numerologies (or subcarrier spacing (SCS)) for supporting diverse 5G services. For example, if the SCS is 15 kHz, a wide area of the conventional cellular bands may be supported. If the SCS is 30 kHz/60 kHz, a dense-urban, lower latency, and wider carrier bandwidth is supported. If the SCS is 60 kHz or higher, a bandwidth greater than 24.25 GHz is used in order to overcome phase noise.

An NR frequency band may be defined as a frequency range of two types (FR1, FR2). Values of the frequency range may be changed. FR1 and FR2 can be configured as shown in the table below. Also, FR2 may mean millimeter wave (mmW).

TABLE 3

| Frequency Range designation | Corresponding frequency range | Subcarrier Spacing (SCS) |
|---|---|---|
| FR1 | 450 MHz-6000 MHz | 15, 30, 60 kHz |
| FR2 | 24250 MHz-52600 MHz | 60, 120, 240 kHz |

Also, as an example, the above-described numerology may be set differently in a communication system to which the present disclosure is applicable. For example, a Terahertz wave (THz) band may be used as a frequency band higher than the aforementioned FR2. In the THz band, the SCS may be set larger than that of the NR system, and the number of slots may be set differently, and is not limited to the above-described embodiment. The THz band will be described below.

Figure 14:
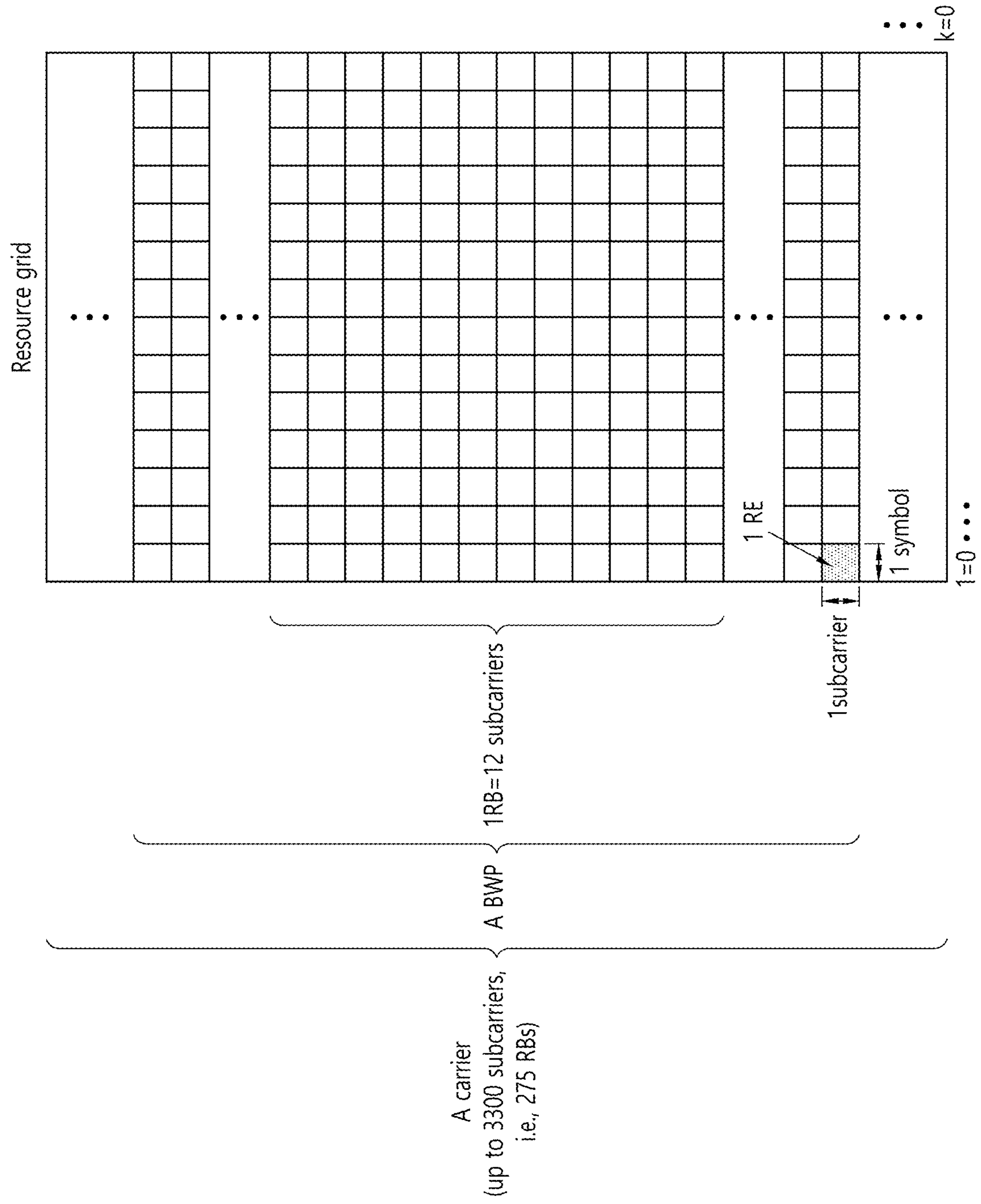
FIG. 14 is a diagram illustrating a slot structure applicable to the present disclosure.

FIG. 14 is a diagram illustrating a slot structure applicable to the present disclosure.

A slot may include a plurality of symbols in a time domain. For example, in case of a normal CP, one slot may include 7 symbols. However, in case of an extended CP, one slot may include 6 symbols. A carrier may include a plurality of subcarriers in a frequency domain. A resource block (RB) may be defined as a plurality of consecutive subcarriers (e.g., 12 subcarriers) in the frequency domain.

In addition, a bandwidth part (BWP) may be defined as a plurality of consecutive (physical) resource blocks ((P) RBs) in the frequency domain, and the BWP may correspond to one numerology (e.g., SCS, CP length, and so on).

The carrier may include up to N (e.g., 5) BWPs. Data communication may be performed via an activated BWP and only one BWP can be activated for one UE. In a resource grid, each element may be referred to as a resource element (RE), and one complex symbol may be mapped thereto.

Hereinafter, a 6G communication system will be described.

6G (radio communications) systems are aimed at (i) very high data rates per device, (ii) very large number of connected devices, (iii) global connectivity, (iv) very low latency, (v) lower energy consumption of battery-free IoT devices, (vi) ultra-reliable connectivity, and (vii) connected intelligence with machine learning capabilities. The vision of 6G systems may be of four aspects: "intelligent connectivity", "deep connectivity", "holographic connectivity", "ubiquitous connectivity". The 6G system can satisfy the requirements shown in Table 4 below. That is, Table 4 is a table showing the requirements of the 6G system.

TABLE 4

| | |
|---|---|
| Per device peak data rate | 1 Tbps |
| E2E latency | 1 ms |
| Maximum spectral efficiency | 100 bps/Hz |
| Mobility support | Up to 1000 km/hr |
| Satellite integration | Fully |
| AI | Fully |

TABLE 4-continued

| | |
|---|---|
| Autonomous vehicle | Fully |
| XR | Fully |
| Haptic Communication | Fully |

At this time, the 6G system may have key factors such as enhanced mobile broadband (eMBB), ultra-reliable low latency communications (URLLC), mMTC (massive machine type communications), AI integrated communication, tactile internet, high throughput, high network capacity, high energy efficiency, low backhaul and access network congestion and enhanced data security.

Figure 15:
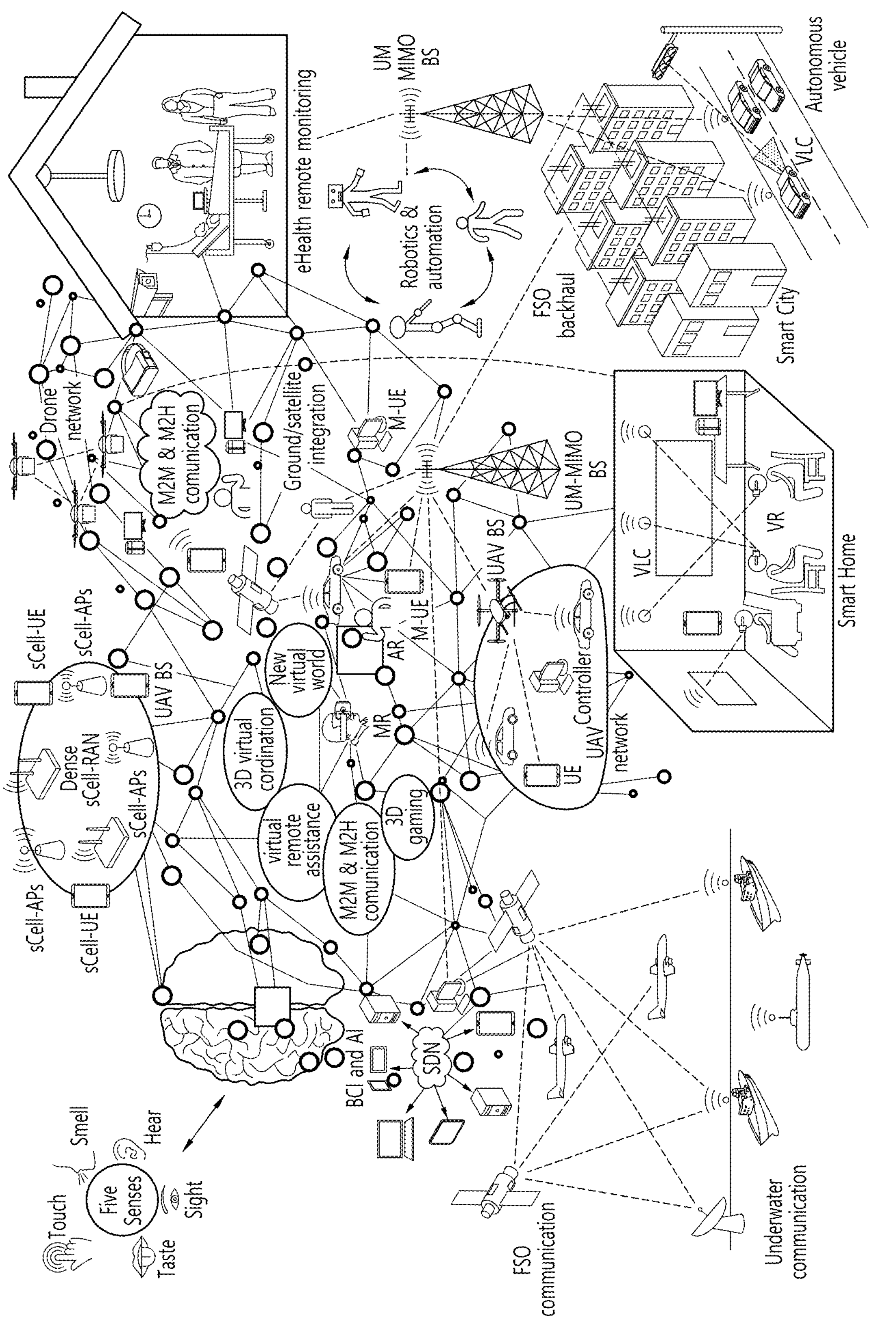
FIG. 15 is a diagram showing an example of a communication structure that can be provided in a 6G system applicable to the present disclosure.

FIG. 15 is a diagram illustrating an example of a communication structure that can be provided in a 6G system applicable to the present disclosure.

Referring to FIG. 15, a 6G system is expected to have 50 times higher simultaneous wireless communication connectivity than a 5G wireless communication system. URLLC, a key feature of 5G, is expected to become a more mainstream technology by providing end-to-end latency of less than 1 ms in 6G communications. At this time, the 6G system will have much better volume spectral efficiency, unlike the frequently used area spectral efficiency. 6G systems can provide very long battery life and advanced battery technology for energy harvesting, so mobile devices in 6G systems may not need to be charged separately. In addition, new network characteristics in 6G may be as follows.

Satellites integrated network: 6G is expected to be integrated with satellites to serve the global mobile population. Integration of terrestrial, satellite and public networks into one wireless communications system could be critical for 6G.

Connected intelligence: Unlike previous generations of wireless communications systems, 6G is revolutionary and will update the wireless evolution from "connected things" to "connected intelligence". AI can be applied at each step of the communication procedure (or each procedure of signal processing to be described later).

Seamless integration wireless information and energy transfer: 6G wireless networks will transfer power to charge the batteries of devices such as smartphones and sensors. Therefore, wireless information and energy transfer (WIET) will be integrated.

Ubiquitous super 3-dimension connectivity: Access to networks and core network capabilities of drones and very low Earth orbit satellites will make super 3-dimension connectivity in 6G ubiquitous.

In the new network characteristics of 6G as above, some general requirements can be as follows.

Small cell networks: The idea of small cell networks has been introduced to improve received signal quality resulting in improved throughput, energy efficiency and spectral efficiency in cellular systems. As a result, small cell networks are an essential feature of 5G and Beyond 5G (5 GB) and beyond communication systems. Therefore, the 6G communication system also adopts the characteristics of the small cell network.

Ultra-dense heterogeneous networks: Ultra-dense heterogeneous networks will be another important feature of 6G communication systems. Multi-tier networks composed of heterogeneous networks improve overall QoS and reduce costs.

High-capacity backhaul: A backhaul connection is characterized by a high-capacity backhaul network to support high-capacity traffic. High-speed fiber and free space optical (FSO) systems may be possible solutions to this problem.

Radar technology integrated with mobile technology: High-precision localization (or location-based service) through communication is one of the features of 6G wireless communication systems. Thus, radar systems will be integrated with 6G networks.

Softwarization and virtualization: Softwarization and virtualization are two important features fundamental to the design process in 5 GB networks to ensure flexibility, reconfigurability and programmability. In addition, billions of devices can be shared in a shared physical infrastructure.

Hereinafter, the core implementation technology of the 6G system will be described.

Artificial Intelligence (AI)

The most important and newly introduced technology for the 6G system is AI. AI was not involved in the 4G system. 5G systems will support partial or very limited AI. However, the 6G system will be AI-enabled for full automation. Advances in machine learning will create more intelligent networks for real-time communication in 6G. Introducing AI in communications can simplify and enhance real-time data transmission. AI can use a plethora of analytics to determine how complex target tasks are performed. In other words, AI can increase efficiency and reduce processing delays.

Time-consuming tasks such as handover, network selection, and resource scheduling can be performed instantly by using AI. AI can also play an important role in machine-to-machine, machine-to-human and human-to-machine communications. In addition, AI can be a rapid communication in the brain computer interface (BCI). AI-based communication systems can be supported by metamaterials, intelligent structures, intelligent networks, intelligent devices, intelligent cognitive radios, self-sustaining wireless networks, and machine learning.

Recently, there have been attempts to integrate AI with wireless communication systems, but these are focused on the application layer, network layer, and in particular, deep learning has been concentrated in the field of wireless resource management and allocation. However, such research is gradually developing into the MAC layer and the physical layer, and in particular, attempts to combine deep learning with wireless transmission are appearing in the physical layer. AI-based physical layer transmission means applying a signal processing and communication mechanism based on an AI driver rather than a traditional communication framework in fundamental signal processing and communication mechanisms. For example, it may include deep learning-based channel coding and decoding, deep learning-based signal estimation and detection, deep learning-based multiple input multiple output (MIMO) mechanism, AI-based resource scheduling and allocation.

Machine learning may be used for channel estimation and channel tracking, and may be used for power allocation, interference cancellation, and the like in a downlink (DL) physical layer. Machine learning can also be used for antenna selection, power control, symbol detection, and the like in a MIMO system.

However, the application of deep neural networks (DNN) for transmission in the physical layer may have the following problems.

AI algorithms based on deep learning require a lot of training data to optimize training parameters. However, due to limitations in acquiring data in a specific channel environment as training data, a lot of training data is used offline. This is because static training on training data in a specific channel environment may cause a contradiction between dynamic characteristics and diversity of a radio channel.

In addition, current deep learning mainly targets real signals. However, the signals of the physical layer of wireless communication are complex signals. In order to match the characteristics of a wireless communication signal, further research is needed on a neural network that detects a complex domain signal.

Hereinafter, machine learning will be described in more detail.

Machine learning refers to a set of actions that train a machine to create a machine that can do tasks that humans can or cannot do. Machine learning requires data and a learning model. In machine learning, data learning methods can be largely classified into three types: supervised learning, unsupervised learning, and reinforcement learning.

Neural network training is aimed at minimizing errors in the output. Neural network learning repeatedly inputs training data to the neural network, calculates the output of the neural network for the training data and the error of the target, and backpropagates the error of the neural network from the output layer of the neural network to the input layer in a direction to reduce the error to update the weight of each node in the neural network.

Supervised learning uses training data in which correct answers are labeled in the training data, and unsupervised learning may not have correct answers labeled in the training data. That is, for example, training data in the case of supervised learning related to data classification may be data in which each training data is labeled with a category. Labeled training data is input to the neural network, and an error may be calculated by comparing the output (category) of the neural network and the label of the training data. The calculated error is back-propagated in a reverse direction (i.e., from the output layer to the input layer) in the neural network, and the connection weight of each node of each layer of the neural network may be updated according to the back-propagation. The amount of change in the connection weight of each updated node may be determined according to a learning rate. The neural network's computation of input data and backpropagation of errors can constitute a learning cycle (epoch). The learning rate may be applied differently according to the number of iterations of the learning cycle of the neural network. For example, a high learning rate is used in the early stages of neural network learning to increase efficiency by allowing the neural network to quickly achieve a certain level of performance, and a low learning rate can be used in the late stage to increase accuracy.

The learning method may vary depending on the characteristics of the data. For example, when the purpose is to accurately predict data transmitted from a transmitter in a communication system by a receiver, it is preferable to perform learning using supervised learning rather than unsupervised learning or reinforcement learning.

The learning model corresponds to the human brain, and the most basic linear model can be considered. A paradigm of machine learning that uses a neural network structure of high complexity, such as artificial neural networks, as a learning model is called deep learning.

The neural network core used as a learning method is largely divided into deep neural networks (DNN), convolutional deep neural networks (CNN), and recurrent boltzmann machine (RNN), and this learning model can be applied.

Hereinafter, THz (Terahertz) communication will be described.

THz communication can be applied in 6G systems. For example, the data transmission rate can be increased by increasing the bandwidth. This can be done using sub-THz communication with wide bandwidth and applying advanced massive MIMO technology.

Figure 16:
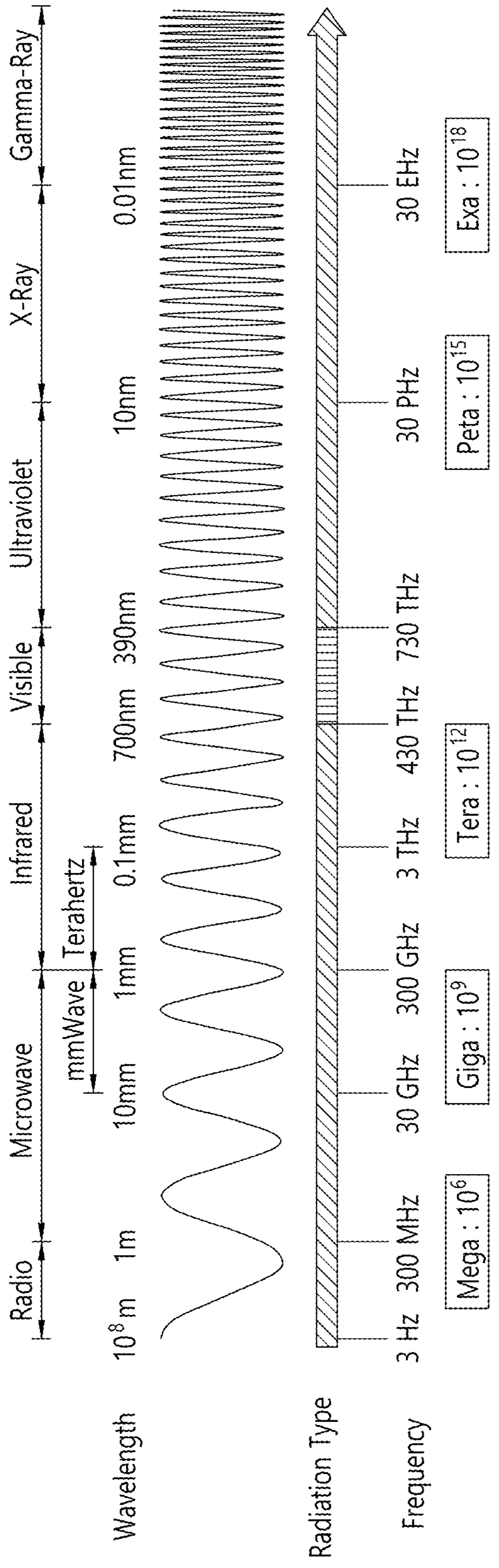
FIG. 16 is a diagram showing an electromagnetic spectrum applicable to the present disclosure.

FIG. 16 is a diagram showing an electromagnetic spectrum applicable to the present disclosure. As an example, referring to FIG. 16, THz waves, also known as submillimeter radiation, generally represent a frequency band between 0.1 THz and 10 THz with corresponding wavelengths in the range of 0.03 mm-3 mm. The 100 GHz-300 GHz band range (sub THz band) is considered a major part of the THz band for cellular communications. Adding to the sub-THz band mmWave band will increase 6G cellular communications capacity. Among the defined THz bands, 300 GHz-3 THz is in the far infrared (IR) frequency band. The 300 GHz-3 THz band is part of the optical band, but is at the border of the optical band, just behind the RF band. Thus, this 300 GHz-3 THz band exhibits similarities to RF.

The main characteristics of THz communications include (i) widely available bandwidth to support very high data rates, and (ii) high path loss at high frequencies (highly directional antennas are indispensable). The narrow beamwidth produced by the highly directional antenna reduces interference. The small wavelength of the THz signal allows a much larger number of antenna elements to be incorporated into devices and BSs operating in this band. This enables advanced adaptive array technology to overcome range limitations.

Hereinafter, optical wireless technology (OWC) will be described.

Optical wireless communication (OWC) technology is envisioned for 6G communications in addition to RF-based communications for all possible device-to-access networks. These networks access network-to-backhaul/fronthaul network connections. OWC technology is already in use after the 4G communication system, but will be more widely used to meet the needs of the 6G communication system. OWC technologies such as light fidelity, visible light communication, optical camera communication, and free space optical (FSO) communication based on an optical band are already well-known technologies. Communications based on optical wireless technology can provide very high data rates, low latency and secure communications. Light detection and ranging (LiDAR) can also be used for super-resolution 3D mapping in 6G communications based on optical band.

Hereinafter, the FSO backhaul network will be described.

The transmitter and receiver characteristics of an FSO system are similar to those of a fiber optic network. Thus, data transmission in FSO systems is similar to fiber optic systems. Therefore, FSO can be a good technology to provide backhaul connectivity in 6G systems along with fiber optic networks. With FSO, very long-distance communication is possible even at a distance of 10,000 km or more. FSO supports high-capacity backhaul connectivity for remote and non-remote locations such as ocean, space, underwater and isolated islands. FSO also supports cellular base station connectivity.

The following describes massive MIMO technology.

One of the key technologies to improve spectral efficiency is to apply MIMO technology. As MIMO technology improves, so does the spectral efficiency. Therefore, massive MIMO technology will be important in 6G systems. Since MIMO technology uses multiple paths, multiplexing technology and beam generation and operation technology suitable for the THz band should be considered as important so that data signals can be transmitted through more than one path.

The block chain is described below.

Blockchain will be an important technology for managing large amounts of data in future communication systems. Blockchain is a form of distributed ledger technology, where a distributed ledger is a database that is distributed across numerous nodes or computing devices. Each node replicates and stores an identical copy of the ledger. Blockchain is managed as a peer to peer (P2P) network. It can exist without being managed by a centralized authority or server. Data on a blockchain is collected together and organized into blocks. Blocks are linked together and protected using cryptography. Blockchain is the perfect complement to the IoT at scale, with inherently improved interoperability, security, privacy, reliability and scalability. Thus, blockchain technology provides multiple capabilities such as interoperability between devices, traceability of large amounts of data, autonomous interaction of other IoT systems, and large-scale connection reliability in 6G communication systems.

3D networking is described below.

The 6G system integrates terrestrial and air networks to support vertical expansion of user communications. 3D BS will be provided via low-orbit satellites and UAVs. Adding a new dimension in terms of height and related degrees of freedom makes 3D connections quite different from traditional 2D networks.

Quantum communication is described below.

In the context of 6G networks, unsupervised reinforcement learning of networks is promising. Supervised learning approaches cannot label the vast amount of data generated by 6G. Labeling is not required in unsupervised learning. Thus, this technique can be used to autonomously build representations of complex networks. Combining reinforcement learning and unsupervised learning allows networks to operate in a truly autonomous way.

Hereinafter, an unmanned aerial vehicle will be described.

Unmanned aerial vehicles (UAVs) or drones will be an important element in 6G wireless communications. In most cases, high-speed data wireless connectivity is provided using UAV technology. Base station entities are installed on UAVs to provide cellular connectivity. UAVs have certain features not found in fixed base station infrastructure, such as ease of deployment, strong line-of-sight links, and degrees of freedom with controlled mobility. During emergencies, such as natural disasters, deployment of terrestrial communications infrastructure is not economically feasible and cannot provide services in sometimes volatile environments. UAVs can easily handle this situation. UAVs will become a new paradigm in the field of wireless communication. This technology facilitates three basic requirements of a wireless network: eMBB, URLLC and mMTC. UAVs can also support multiple purposes, such as enhancing network connectivity, fire detection, disaster emergency services, security and surveillance, pollution monitoring, parking monitoring, accident monitoring, and more. Therefore, UAV technology is recognized as one of the most important technologies for 6G communication.

Hereinafter, cell-free communication will be described.

The tight integration of multiple frequencies and heterogeneous communication technologies is critical for 6G systems. As a result, users can seamlessly move from one network to another without having to make any manual configuration on the device. The best network is automatically selected from available communication technologies. This will break the limitations of the cell concept in wireless communication. Currently, user migration from one cell to another causes too many handovers in high-density networks, leading to handover failures, handover delays, data loss and ping-pong effects. 6G cell-free communication will overcome all of this and provide better QoS. Cell-free communication will be achieved through multi-connectivity and multi-tier hybrid technologies and different heterogeneous radios of devices.

In the following, wireless information and energy transfer (WIET) is described.

WIET uses the same fields and waves as wireless communication systems. In particular, sensors and smartphones will be charged using wireless power transfer during communication. WIET is a promising technology for extending the lifetime of battery charging wireless systems. Thus, battery-less devices will be supported in 6G communications.

The following describes the integration of sensing and communication.

Autonomous wireless networks are the ability to continuously sense dynamically changing environmental conditions and exchange information between different nodes. In 6G, sensing will be tightly integrated with communications to support autonomous systems.

The following describes integration of access backhaul networks.

In 6G, the density of access networks will be enormous. Each access network is connected by fiber and backhaul connections such as FSO networks. To cope with the very large number of access networks, there will be tight integration between access and backhaul networks.

Hereinafter, hologram beamforming will be described.

Beamforming is a signal processing procedure that adjusts an antenna array to transmit radio signals in a specific direction. It is a subset of smart antennas or advanced antenna systems. Beamforming technology has several advantages such as high signal-to-noise ratio, interference avoidance and rejection, and high network efficiency. Hologram beamforming (HBF) is a new beamforming method that differs significantly from MIMO systems because it uses software-defined antennas. HBF will be a very effective approach for efficient and flexible transmission and reception of signals in multi-antenna communication devices in 6G.

Hereinafter, big data analysis will be described.

Big data analysis is a complex process for analyzing various large data sets or big data. This process ensures complete data management by finding information such as hidden data, unknown correlations and customer preferences. Big data is collected from various sources such as videos, social networks, images and sensors. This technology is widely used to process massive data in 6G systems.

Hereinafter, a large intelligent surface (LIS) will be described.

In the case of THz band signals, there may be many shadow areas due to obstructions due to strong linearity. By installing LIS near these shadow areas, LIS technology that expands the communication area, strengthens communication stability and provides additional services becomes important. An LIS is an artificial surface made of electromagnetic materials and can change the propagation of incoming and outgoing radio waves. LIS can be seen as an extension of Massive MIMO, but has a different array structure and operating mechanism from Massive MIMO. In addition, the LIS has an advantage of low power consumption in that it operates as a reconfigurable reflector with passive elements, that is, it only passively reflects the signal without using an active RF chain. In addition, since each passive reflector of the LIS should independently adjust the phase shift of an incident signal, it may be advantageous for a wireless communication channel. By properly adjusting the phase shift through the LIS controller, the reflected signal can be collected at the target receiver to boost the received signal power.

Hereinafter, terahertz (THz) wireless communication will be described.

Figure 17:
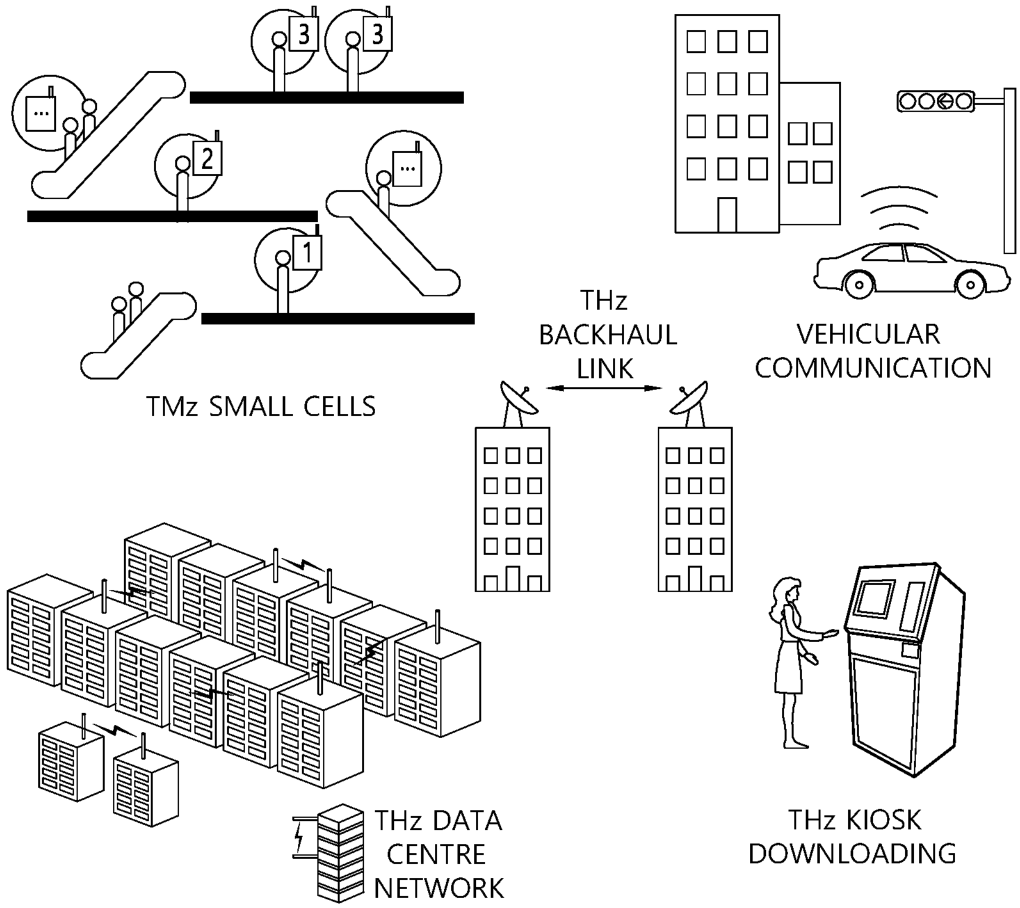
FIG. 17 is a diagram illustrating a THz communication method applicable to the present disclosure.

FIG. 17 is a diagram illustrating a THz communication method applicable to the present disclosure.

Referring to FIG. 17, THz wireless communication can mean wireless communication using THz waves having a frequency of approximately 0.1 to 10 THz (1 THz=$10^{12}$ Hz), and a terahertz (THz) band radio using a very high carrier frequency of 100 GHz or more. THz waves are located between RF (Radio Frequency)/millimeter (mm) and infrared bands, (i) it transmits non-metallic/non-polarizable materials better than visible light/infrared rays, and has a shorter wavelength than RF/millimeter wave, so it has high straightness and may be capable of beam focusing.

In addition, since the photon energy of the THz wave is only a few meV, it is harmless to the human body. A frequency band expected to be used for THz wireless communication may be a D-band (110 GHz to 170 GHz) or H-band (220 GHz to 325 GHz) band with low propagation loss due to molecular absorption in the air. In addition to 3GPP, standardization discussions on THz wireless communication are being discussed centering on the IEEE 802.15 THz working group (WG). Standard documents issued by the TG (task group) of IEEE 802.15 (e.g., TG3d, TG3e) may materialize or supplement the contents described in this specification. THz wireless communication may be applied to wireless cognition, sensing, imaging, wireless communication, THz navigation, and the like.

Specifically, referring to FIG. 17, a THz wireless communication scenario can be classified into a macro network, a micro network, and a nanoscale network. In macro networks, THz wireless communication can be applied to vehicle-to-vehicle (V2V) connections and backhaul/fronthaul connections. In micro networks, THz wireless communication can be applied to indoor small cells, fixed point-to-point or multi-point connections such as wireless connections in data centers, and near-field communication such as kiosk downloading. Table 5 below is a table showing an example of a technique that can be used in THz waves.

TABLE 5

| | |
|---|---|
| Transceivers Device | Available immature: UTC-PD, RTD and SBD |
| Modulation and coding | Low order modulation techniques (OOK, QPSK), LDPC, Reed Soloman, Hamming, Polar, Turbo |
| Antenna | Omni and Directional, phased array with low number of antenna elements |
| Bandwidth | 69 GHz (or 23 GHz) at 300 GHz |
| Channel models | Partially |
| Data rate | 100 Gbps |
| Outdoor deployment | No |
| Free space loss | High |
| Coverage | Low |
| Radio Measurements | 300 GHz indoor |
| Device size | Few micrometers |

Figure 18:
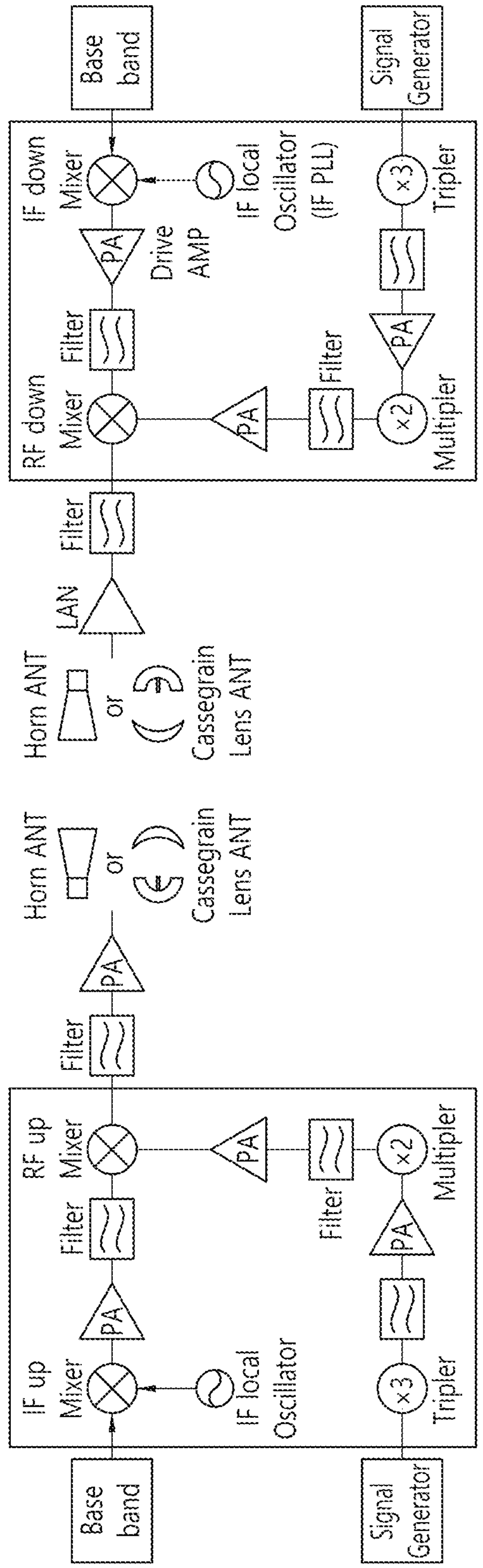
FIG. 18 is a diagram illustrating a THz wireless communication transceiver applicable to the present disclosure.

FIG. 18 is a diagram illustrating a THz wireless communication transceiver applicable to the present disclosure.

Referring to FIG. 18, THz wireless communication can be classified based on a method for generating and receiving THz. The THz generation method can be classified as an optical device or an electronic device based technology.

At this time, the method of generating THz using an electronic device can be a method using a semiconductor device such as a resonant tunneling diode (RTD), a method using a local oscillator and a multiplier, a method using a compound semiconductor HEMT (high electron mobility transistor) based integrated circuit MMIC (monolithic microwave integrated circuits) method, a Si-CMOS based integrated circuit method, and the like. In the case of FIG. 18, a doubler, tripler, or multiplier is applied to increase the frequency, and the radiation is emitted by the antenna after passing through the subharmonic mixer. Since the THz band forms high frequencies, a multiplier is essential. Here, the multiplier is a circuit that makes the output frequency N times greater than the input, matches the desired harmonic frequency, and filters out all other frequencies. In addition, beamforming may be implemented by applying an array antenna or the like to the antenna of FIG. 18. In FIG. 18, IF denotes an intermediate frequency, a tripler and a multiplier denote a multiplier, PA denotes a power amplifier, and LNA denotes a low noise amplifier, PLL represents a phase-locked loop.

Figure 19:
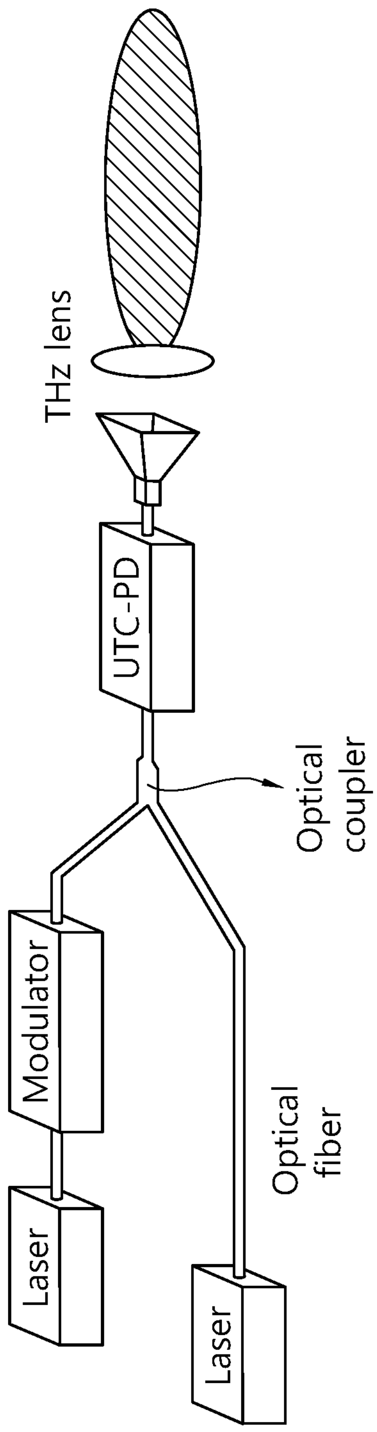
FIG. 19 is a diagram illustrating a THz signal generation method applicable to the present disclosure.
Figure 20:
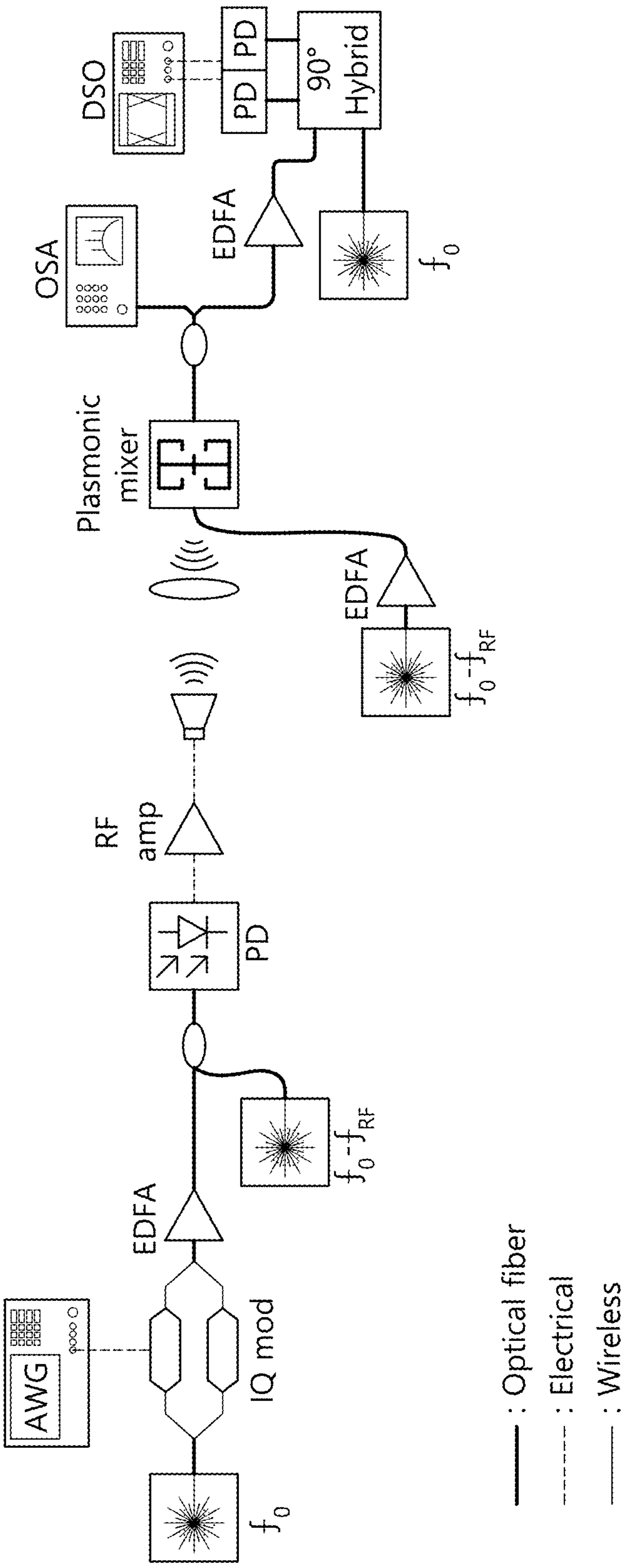
FIG. 20 is a diagram illustrating a wireless communication transceiver applicable to the present disclosure.

FIG. 19 is a diagram illustrating a THz signal generation method applicable to the present disclosure. FIG. 20 is a diagram illustrating a wireless communication transceiver applicable to the present disclosure.

Referring to FIGS. 19 and 20, the optical device-based THz wireless communication technology refers to a method of generating and modulating a THz signal using an optical device. An optical device-based THz signal generation technology is a technology that generates an ultra-high speed optical signal using a laser and an optical modulator and converts it into a THz signal using an ultra-high speed photodetector. Compared to a technique using only an electronic device, this technique can easily increase the frequency, generate a high-power signal, and obtain flat response characteristics in a wide frequency band. As shown in FIG. 19, a laser diode, a broadband optical modulator, and a high-speed photodetector are required to generate a THz signal based on an optical device. In the case of FIG. 19, a THz signal corresponding to a wavelength difference between the lasers is generated by multiplexing light signals of two lasers having different wavelengths. In FIG. 19, an optical coupler refers to a semiconductor device that transmits an electrical signal using light waves to provide electrical isolation and coupling between circuits or systems. A uni-travelling carrier photo-detector (UTC-PD) is a type of photodetector that uses electrons as active carriers and reduces the travel time of electrons through bandgap grading. UTC-PD is capable of photodetection above 150 GHz. In FIG. 20, EDFA represents an erbium-doped fiber amplifier, a photo detector (PD) represents a semiconductor device capable of converting an optical signal into an electrical signal, and an OSA (optical sub assembly) is an optical module in which various optical communication functions (e.g., photoelectric conversion, electric optical conversion, etc.) are modularized into one component, and DSO represents a digital storage oscilloscope.

Figure 21:
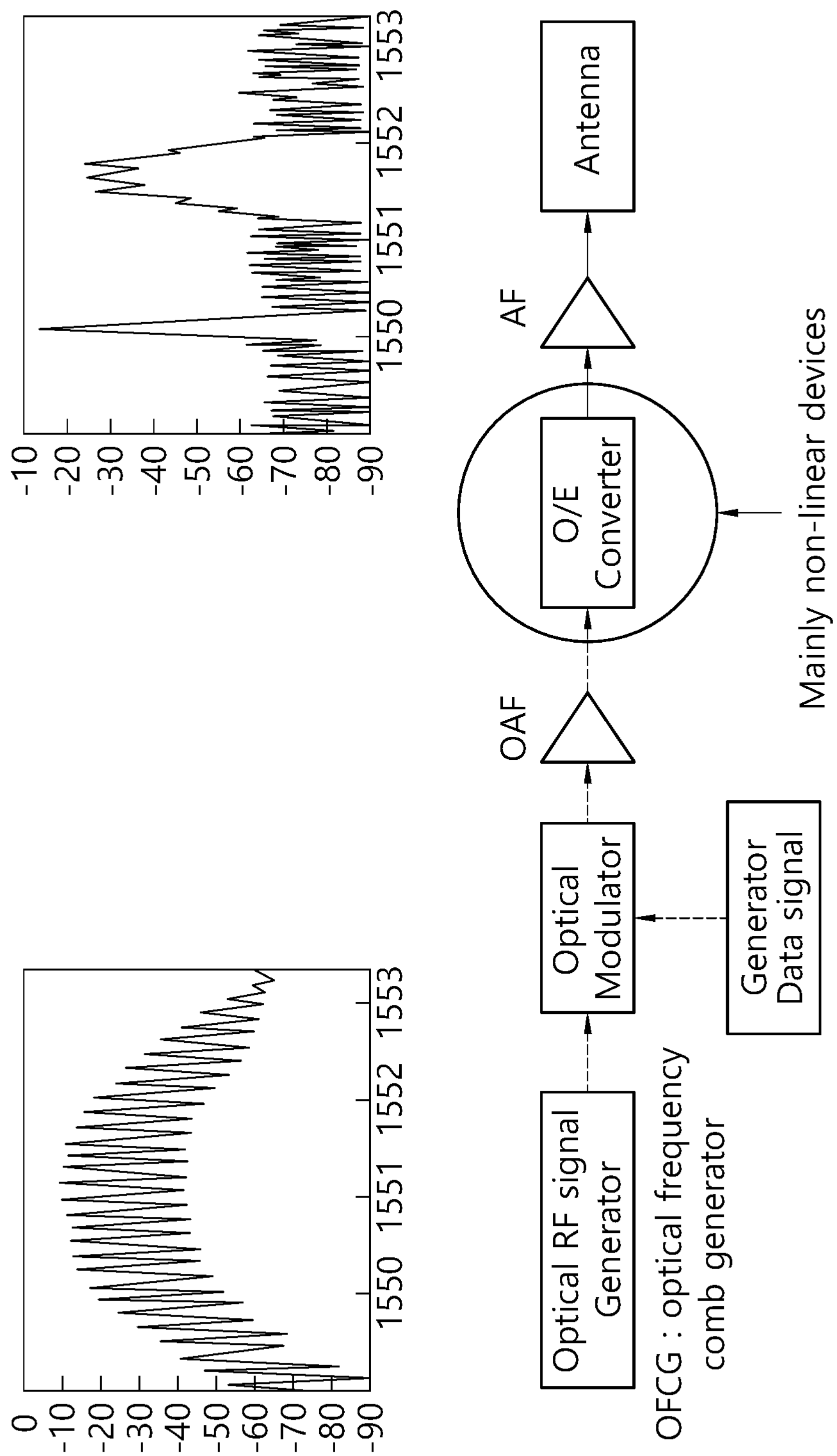
FIG. 21 is a diagram illustrating a transmitter structure applicable to the present disclosure.
Figure 22:
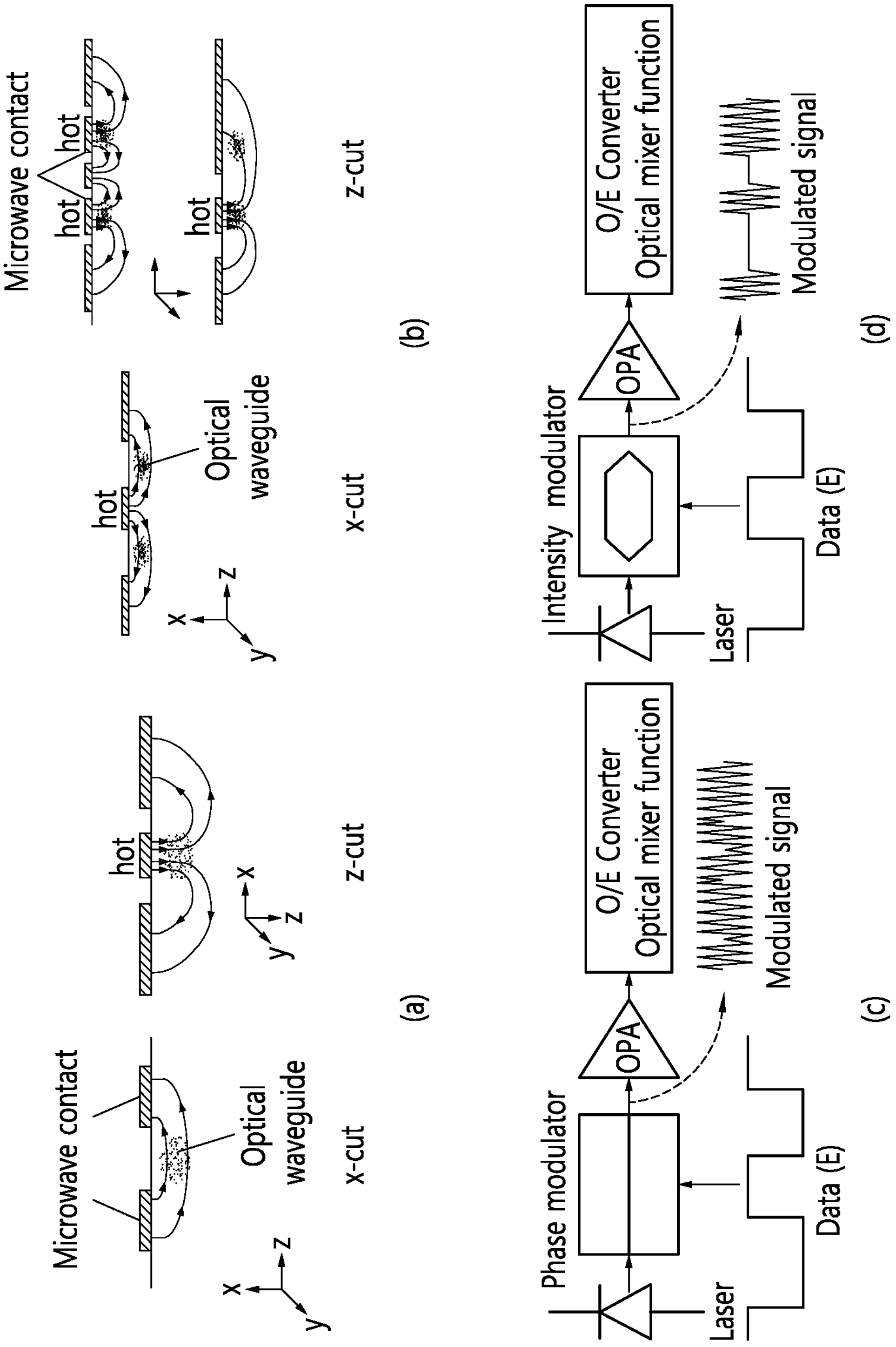
FIG. 22 is a diagram showing a modulator structure applicable to the present disclosure.

FIG. 21 is a diagram illustrating a transmitter structure applicable to the present disclosure. FIG. 22 is a diagram showing a modulator structure applicable to the present disclosure.

Referring to FIGS. 21 and 22, in general, a phase of a signal may be changed by passing an optical source of a laser through an optical wave guide. At this time, data is loaded by changing electrical characteristics through a microwave contact or the like. Thus, the optical modulator output is formed into a modulated waveform. The O/E converter may generate THz pulses according to an optical rectification operation by a nonlinear crystal, O/E conversion by a photoconductive antenna, emission from a bunch of relativistic electrons, or the like. A THz pulse generated in the above manner may have a unit length of femto second to pico second. An O/E converter uses non-linearity of a device to perform down conversion.

Considering the use of the terahertz spectrum (THz spectrum usage), for a terahertz system, it is highly likely to use several contiguous GHz bands for fixed or mobile service purposes. According to outdoor scenario standards, available bandwidth may be classified based on oxygen attenuation of $10^2$ dB/km in a spectrum up to 1 THz. Accordingly, a framework in which the available bandwidth is composed of several band chunks may be considered. As an example of the framework, if the length of a THz pulse is set to 50 ps for one carrier, the bandwidth (BW) becomes about 20 GHz.

Effective down conversion from the infrared band to the THz band depends on how to utilize the nonlinearity of the O/E converter. That is, in order to down-convert to the desired terahertz band (THz band), the photoelectric converter (O/E converter) having the most ideal non-linearity to move to the corresponding terahertz band (THz band) design is required. If an O/E converter that does not fit the target frequency band is used, there is a high possibility that an error will occur with respect to the amplitude and phase of the corresponding pulse.

In a single carrier system, a terahertz transmission/reception system may be implemented using one photoelectric converter. Depending on the channel environment, in a multi-carrier system, as many photoelectric converters as the number of carriers may be required. In particular, in the case of a multi-carrier system using several broadbands according to a plan related to the above-mentioned spectrum use, the phenomenon will be conspicuous. In this regard, a frame structure for the multi-carrier system may be considered. A signal down-frequency converted based on the photoelectric converter may be transmitted in a specific resource region (e.g., a specific frame). The frequency domain of the specific resource domain may include a plurality of chunks. Each chunk may consist of at least one component carrier (CC).

Hereinafter, a neural network or a neural network will be described.

A neural network is a machine learning model modeled after the human brain. What computers can do well is the four arithmetic operations made up of 0 and 1. Thanks to the development of technology, computers can now process much more arithmetic operations in a faster time and with less power than before. On the other hand, humans cannot perform arithmetic operations as fast as computers. That's because the human brain isn't built to handle only fast arithmetic. However, in order to process something beyond cognition, natural language processing, etc., it needs to be able to do things beyond the four arithmetic operations, but current computers cannot process those things to the level that the human brain can. Therefore, in areas such as natural language processing and computer vision, if we can create systems that perform similarly to humans, great technological advances can occur. That's why, before chasing after human ability, you will be able to come up with an idea to imitate the human brain first. A neural network is a simple mathematical model built around this motivation. We already know that the human brain consists of an enormous number of neurons and the synapses that connect them. In addition, depending on how each neuron is activated, other neurons will also take actions such as being activated or not activated. Then, based on these facts, it is possible to define the following simple mathematical model.

Figure 23:
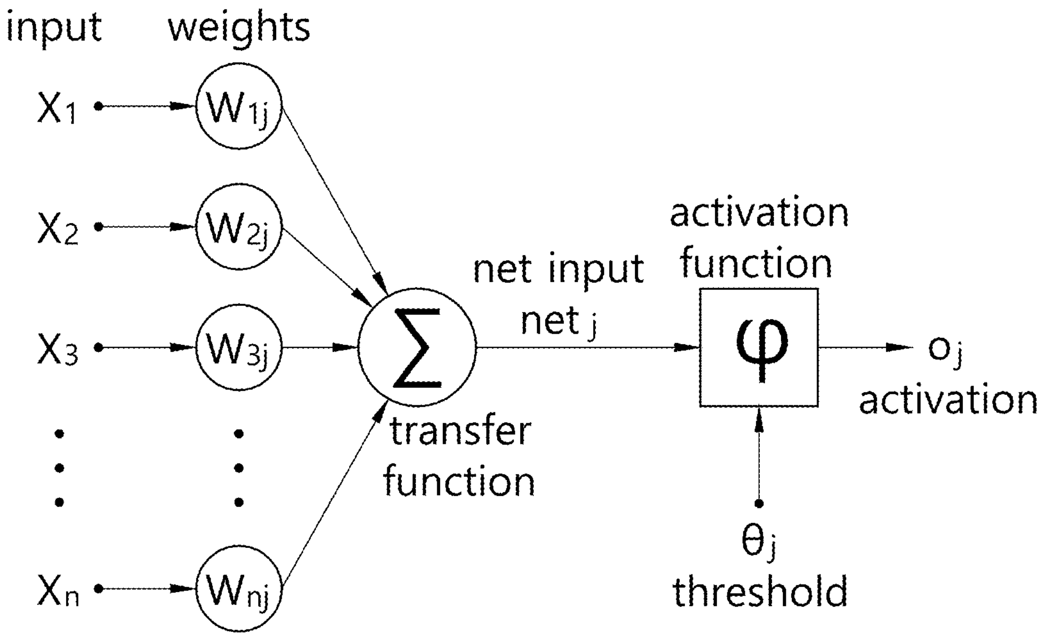
FIG. 23 shows an example of a neural network model.

FIG. 23 shows an example of a neural network model.

First, it is possible to create a network in which each neuron is a node and the synapse connecting the neurons is an edge. Since the importance of each synapse may be different, if a weight is separately defined for each edge, a network can be created in the form shown in FIG. 23. Usually, neural networks are directed graphs. That is, information propagation is fixed in one direction. If an undirected edge is provided or the same directed edge is given in both directions, information propagation occurs recursively, resulting in a slightly complicated result. This case is called a recurrent neural network (RNN), and since it has an effect of storing past data, it is widely used when processing sequential data such as voice recognition. The multi-layer perceptron (MLP) structure is a directed simple graph, and there is no connection between the same layers. That is, there are no self-loops and parallel edges, edges exist only between layers, and only layers adjacent to each other have edges. That is, there is no edge directly connecting the first layer to the fourth layer. In the below, these MLPs are assumed unless there is a specific mention of the layer. In this case, information propagation occurs only forward, so such a network is also called a feed-forward network.

In the actual brain, different neurons are activated, and the result is passed on to the next neuron, and as the result is passed on, and the way the neurons that make the final decision are activated will process the information. If we convert this method into a mathematical model, it may be possible to express activation conditions for input data as a function. This is defined as an activation function or activate function. The simplest example of an activation function would be a function that adds up all incoming input values and then sets a threshold so that it activates when this value exceeds a certain value and deactivates it when it does not exceed that value. There are several types of activation functions that are commonly used, and some are introduced below. For convenience, it is defined as $t=\Sigma_i(w_i x_i)$. For reference, in general, not only weights but also biases should be considered. In this case, $t=\Sigma_i(w_i x_i)+b_i$, but in this specification, the bias is omitted because it is almost the same as the weight. For example, if $x_0$ whose value is always 1 is added, since $w_0$ becomes a bias, it is okay to assume a virtual input and treat the weight and bias as the same.

$$f(t)=1/(1+e^{-t}) \qquad \text{Sigmoid function:}$$

$$f(t)=(1-e^{-t})/(1+e^{-t}) \qquad \text{Hyperbolic tangent function (tanh function):}$$

$$f(t)=\|t\| \qquad \text{Absolute function:}$$

$$f(t)=\max(0,t) \qquad \text{Rectified Linear Unit function (ReLU function):}$$

Therefore, the model first defines the shape of a network composed of nodes and edges, and defines an activation function for each node. The weight of the edge plays the role of a parameter adjusting the model determined in this way, and finding the most appropriate weight can be a goal when training the mathematical model.

Hereinafter, it is assumed that all parameters are determined and how the neural network infers the result will be described. A neural network first determines the activation of the next layer for a given input, and then uses that to determine the activation of the next layer. In this way, decisions are made up to the last layer, and inference is determined by looking at the results of the last decision layer.

Figure 24:
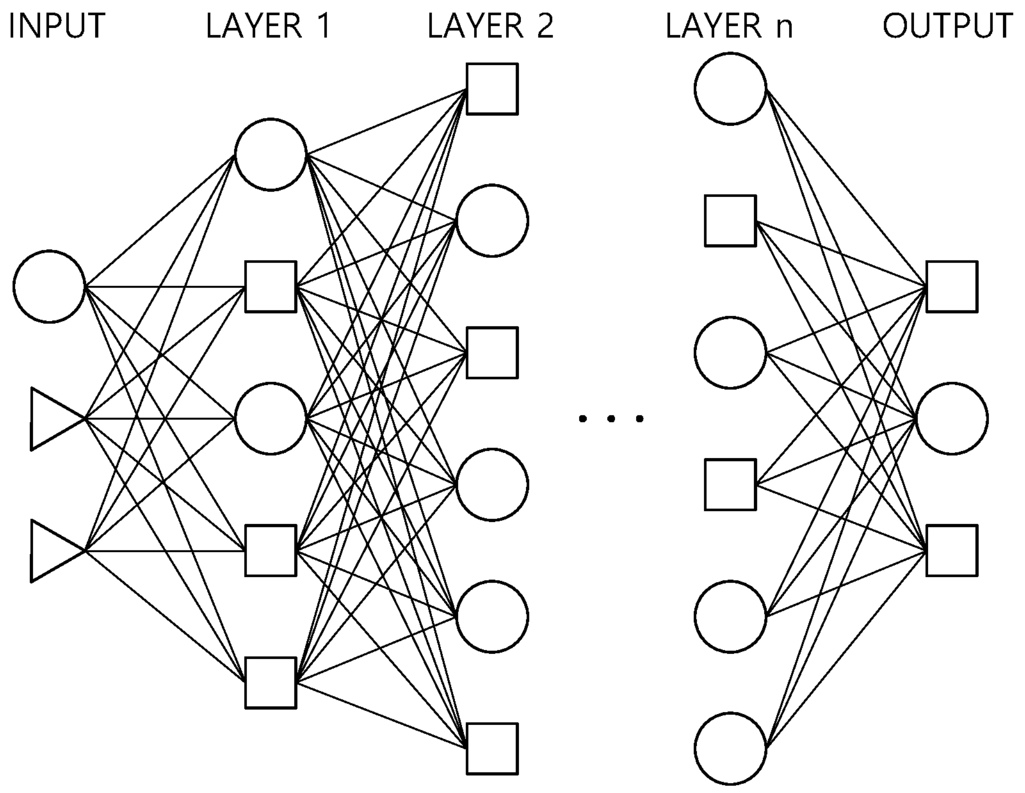
FIG. 24 shows an example of an activated node in a neural network.

FIG. 24 shows an example of an activated node in a neural network.

Nodes circled in FIG. 24 represent activated nodes. For example, in the case of classification, as many decision nodes as the number of classes or classes the user wants to classify can be created in the last layer, and then one activated value can be selected.

Since the activation functions of the neural network are non-linear and are complexly entangled while forming layers with each other, weight optimization of the neural network may be non-convex optimization. Therefore, it is impossible to find a global optimum of parameters of a neural network in a general case. Therefore, it is possible to use a method of converging to an appropriate value using a normal gradient descent (GD) method. Any optimization problem can be solved only when a target function is defined. In a neural network, a method of minimizing the value by calculating a loss function between the target output actually desired in the last decision layer and the estimated output produced by the current network can be taken. Commonly chosen loss functions include the following functions. Meanwhile, the d-dimensional target output is defined as $t=[t_1, \ldots, t_d]$ and the estimated output is defined as $x=[x_1, \ldots, x_d]$. Various loss functions for optimization can be used, and the following is an example of a representative loss function.

$$\text{Sum of Euclidean loss: } \sum_{i=1}^{d} (t_i - x_i)^2$$

$$\text{Softmax loss: } -\sum_{i=1}^{d} t_i \log \frac{e^{x_j}}{\sum_{j=1}^{d} e^{x_j}} + (1 - t_i)\log\left(1 - \frac{e^{x_j}}{\sum_{j=1}^{d} e^{x_j}}\right)$$

$$\text{Cross-entropy loss: } \sum_{i=1}^{d} - t_i \log x_i + (1 - t_i)\log(1 - x_i)$$

If the loss function is given in this way, the gradient can be obtained for the given parameters and then the parameters can be updated using the values.

On the other hand, the backpropagation algorithm is an algorithm that simplifies the gradient calculation by using the chain rule, and when calculating the slope of each parameter, parallelization is easy and memory efficiency can be increased according to the algorithm design, so the actual neural network update mainly uses the backpropagation algorithm. In order to use the gradient descent method, it is necessary to calculate the gradient for the current parameter, but if the network becomes complex, it may be difficult to calculate the value immediately. Instead, according to the backpropagation algorithm, it first calculates the loss using the current parameters, calculates how much each parameter affects the loss using the chain rule, and updates with that value. Accordingly, the backpropagation algorithm can be largely divided into two phases, one is a propagation phase and the other is a weight update phase. In the propagation phase, an error or variation of each neuron is calculated from the training input pattern, and in the weight update phase, the weight is updated using the previously calculated value.

Specifically, in the propagation phase, forward propagation or backpropagation may be performed. Forward propagation computes the output from the input training data and computes the error in each neuron. At this time, since information moves in the order of input neuron-hidden neuron-output neuron, it is called forward propagation. In backpropagation, the error calculated in the output neuron is calculated by using the weight of each edge to determine how much the neurons in the previous layer contributed to the error. At this time, since the information moves in the order of the output neuron-hidden neuron, it is called backpropagation.

In addition, in the weight update phase, the weights of the parameters are calculated using the chain rule. In this case, the meaning of using the chain rule may mean that the current gradient value is updated using the previously calculated gradient as shown in FIG. 25.

Figure 25:
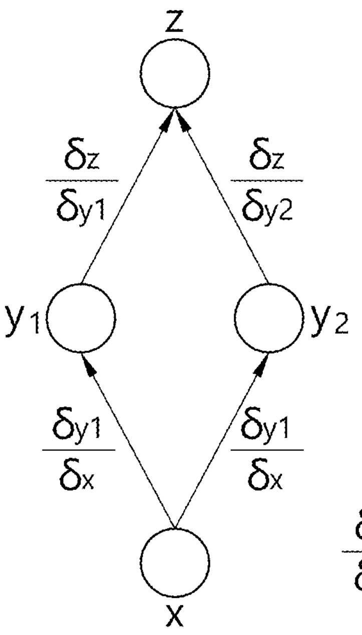
FIG. 25 shows an example of gradient calculation using the chain rule.
Figure 25:
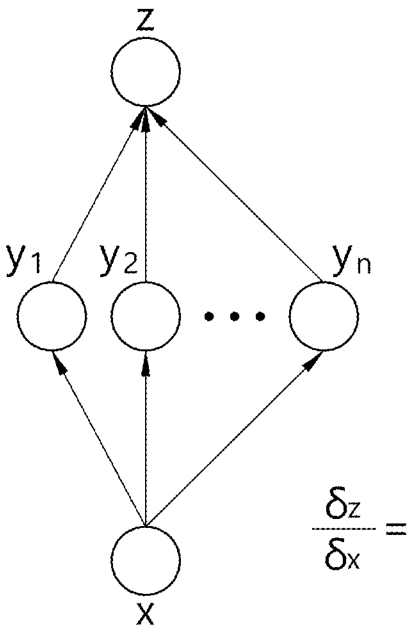

FIG. 25 shows an example of gradient calculation using the chain rule.

The purpose of FIG. 25 is to find (δz)/(δx), instead of directly calculating the value, a desired value can be calculated using (δz)/(δy), which is a derivative calculated in the y-layer, and (δy)/(δx) related only to the y-layer and x. If a parameter x' exists separately before x, (δz)/(δx') can be calculated using (δz)/(δx) and (δx')/(δx). Therefore, what is required in the backpropagation algorithm is the differential value of the variable just before the current parameter to be updated and the value obtained by differentiating the immediately preceding variable with the current parameter. This process is repeated step by step from the output layer. That is, the weight may be continuously updated through the process of output-hidden neuron k, hidden neuron k-hidden neuron k−1, . . . , hidden neuron 2-hidden neuron 1, hidden neuron 1-input.

Computing the gradient updates the parameters using gradient descent. However, in general, since the number of input data of a neural network is quite large, in order to calculate an accurate gradient, it is sufficient to calculate all gradients for all training data, obtain an accurate gradient using the average of the values, and perform an update once. However, since this method is inefficient, a stochastic gradient descent (SGD) method can be used.

In SGD, instead of performing a gradient update by averaging the gradients of all data (this is called a full batch), all parameters can be updated by creating a mini-batch with some data and calculating the gradient for only one batch. In the case of convex optimization, it has been proven that SGD and GD converge to the same global optimum if certain conditions are satisfied. However, since neural networks are not convex, the conditions for convergence change depending on how they are placed.

Hereinafter, types of neural networks will be described.

First, a convolution neural network (CNN) will be described.

CNN is a kind of neural network mainly used for speech recognition or image recognition. It is configured to process multidimensional array data, and is specialized in processing multidimensional arrays such as color images. Therefore, most techniques using deep learning in the field of image recognition are based on CNN. In the case of a general neural network, image data is processed as it is. That is, since the entire image is considered as one piece of data and accepted as an input, correct performance may not be obtained if the characteristics of the image are not found and the position of the image is slightly changed or distorted. However, CNN processes an image by dividing it into several pieces rather than one piece of data. In this way, even if the image is distorted, partial features of the image can be extracted, resulting in correct performance. CNN can be defined in the following terms.

Convolution: The convolution operation means that one of the two functions f and g is reversed or shifted, and then the multiplication result with the other function is integrated. In the discrete domain, use sum instead of integral.

Channel: This refers to the number of data columns constituting input or output when convolution is performed.

Filter or Kernel: A function that performs convolution on input data.

Dilation: It refers to the interval between data when convolution is performed on the data and the kernel. For example, if the dilation is 2, extract one every two of the input data and perform convolution with the kernel.

Stride: It means the interval at which filters/kernels are shifted when performing convolution.

Padding: It means an operation of adding a specific value to input data when performing convolution, and the specific value is usually 0.

Feature map: Refers to the output result of performing convolution.

Next, a recurrent neural network (RNN) will be described.

RNN is a type of artificial neural network in which hidden nodes are connected with directed edges to form a directed cycle. It is known as a model suitable for processing data that appears sequentially, such as voice and text, and is an algorithm that has recently been in the limelight along with CNN. Since it is a network structure that can accept inputs and outputs regardless of sequence length, the biggest advantage of RNN is that it can create various and flexible structures as needed.

Figure 26:
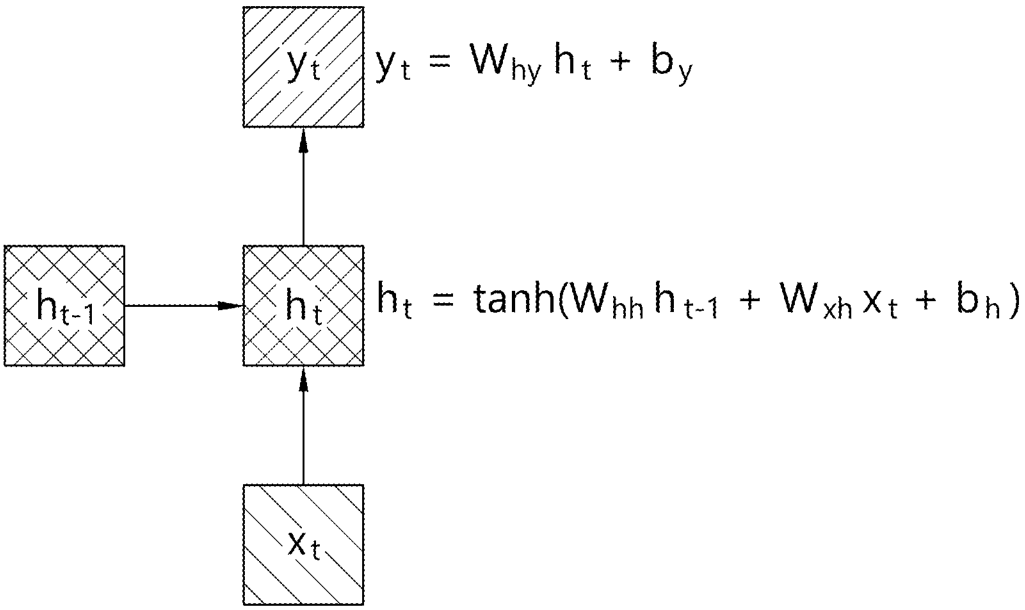
FIG. 26 shows an example of the basic structure of an RNN.

FIG. 26 shows an example of the basic structure of an RNN.

In FIG. 26, h_t (t=1, 2, . . . ) is a hidden layer, x represents an input, and y represents an output. It is known that in RNN, when the distance between the relevant information and the point where the information is used is long, the gradient gradually decreases during backpropagation, resulting in a significant decrease in learning ability. This is called the vanishing gradient problem. The structures proposed to solve the problem of vanishing gradients are long-short term memory (LSTM) and gated recurrent unit (GRU).

Hereinafter, an autoencoder will be described.

Various attempts have been made to apply neural networks to communication systems. Among them, attempts to apply to the physical layer are mainly considering optimizing a specific function of a receiver. For example, performance can be improved by configuring a channel decoder as a neural network. Alternatively, performance may be improved by implementing a MIMO detector as a neural network in a MIMO system having a plurality of transmit/receive antennas.

Another approach is to construct both a transmitter and a receiver as a neural network and perform optimization from an end-to-end perspective to improve performance, which is called an autoencoder.

Figure 27:
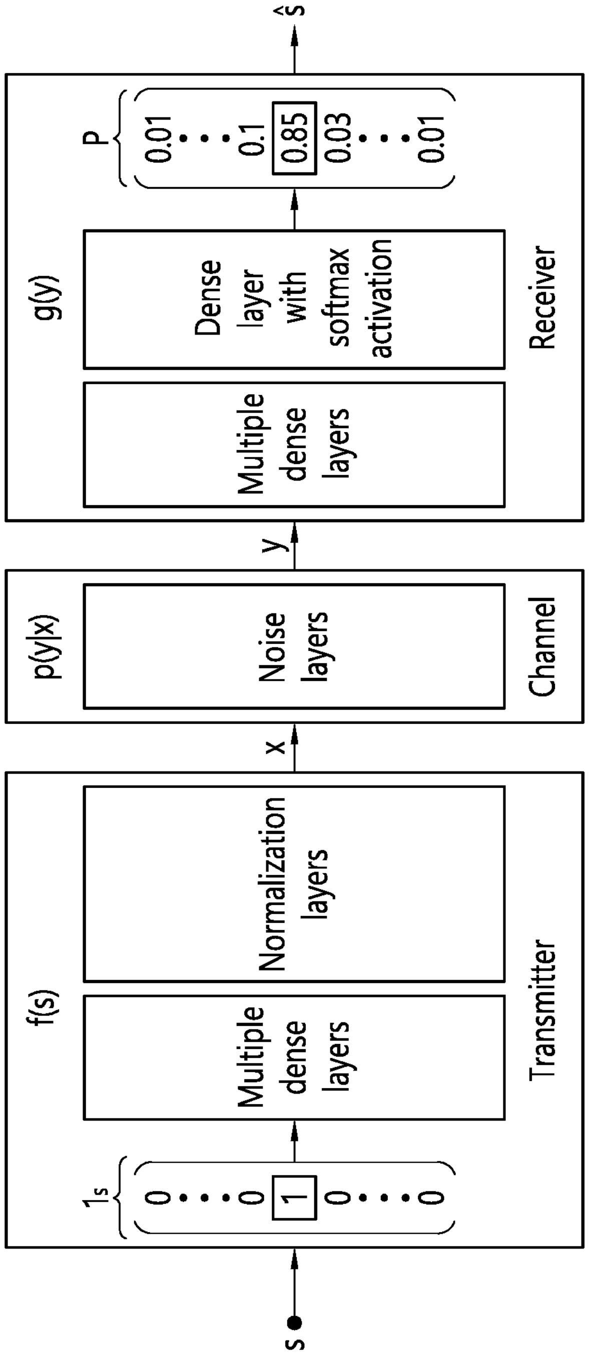
FIG. 27 shows an example of an autoencoder.

FIG. 27 shows an example of an autoencoder.

Referring to FIG. 27, an input signal sequentially proceeds to a transmitter, a channel, and a receiver. Here, as an example, when the input signal is a 5-bit signal, the 5-bit signal can be expressed in 32 ways, which can be expressed as a vector of one row or one column having 32 elements. When the vector passes through the transmitter and the channel and reaches the receiver, the receiver can obtain information according to the contents of the detected vector.

The autoencoder structure of FIG. 27 has a problem in which complexity increases exponentially as the input data block size K increases, that is, a curse of dimensionality occurs. In this case, when designing a structured transmitter, the above problem can be solved, and a turbo autoencoder (turbo AE) can be considered as one of the structured transmitters. The structure of the encoder and decoder of the turbo autoencoder is shown in FIG. 28.

Figure 28:
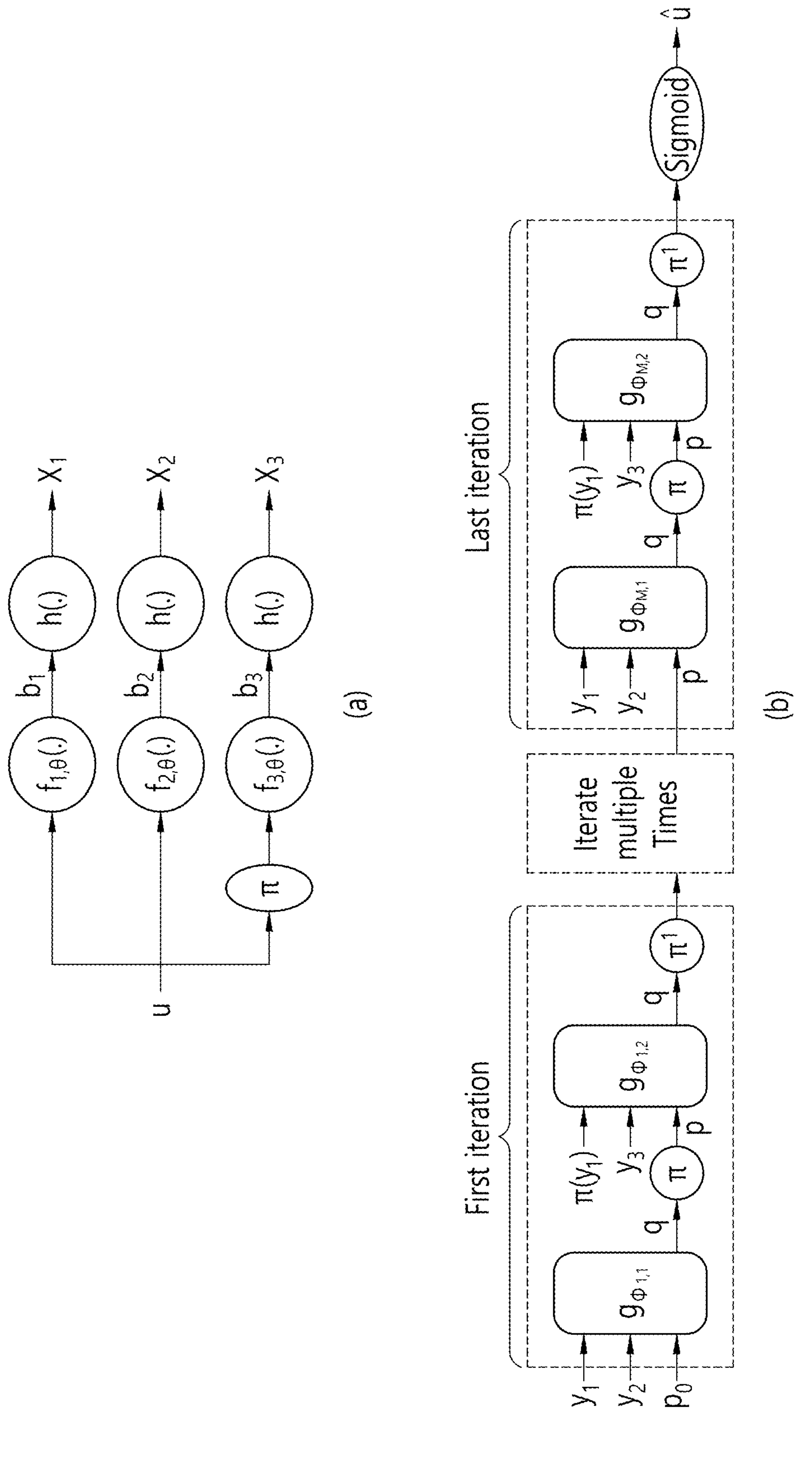
FIG. 28 shows an example of an encoder structure and a decoder structure of a turbo autoencoder.

FIG. 28 shows an example of an encoder structure and a decoder structure of a turbo autoencoder. Specifically, (a) of FIG. 28 shows the structure of a neural network encoder, and (b) of FIG. 28 shows the structure of a neural network decoder.

(a) of FIG. 28 shows an encoder structure with a code rate of 1/3, where $f_{i,\theta}$ represent a neural network and h(•) represents a power constraint. Also, π means an interleaver. (b) of FIG. 28 shows the decoder structure, adopting a method similar to the iterative decoding method of the turbo decoder, and is composed of two sub-decoders for each iterative decoding. Here, $g_{0i,j}$ denotes the j-th sub-decoder at the i-th iterative decoding.

Since the complexity of the autoencoder exponentially increases as the size of the input data block increases, the structure shown in FIG. 27 is not suitable for data transmission with a large block size. The autoencoder structure as shown in FIG. 28 that solves this problem is capable of transmitting data of a relatively large block size, but is more complicated than conventional channel coding systems. Table 6 below compares the complexity of turbo autoencoders for a block size of 100. FLOP in Table 6 is a floating-point operation number, and EMO represents an elementary math operation. The complexity of neural encoder and neural decoder using CNN/RNN was calculated with FLOP, and the complexity of turbo encoder and turbo decoder was calculated with EMO.

TABLE 6

| Metric | CNN encoder | CNN decoder | RNN encoder | RNN decoder | Turbo encoder | Turbo decoder |
|---|---|---|---|---|---|---|
| FLOP/EMO | 1.8M | 294.15M | 33.4M | 6.7 G | 104K | 408K |
| Weight | 157.4K | 2.45M | 1.14M | 2.71M | N/A | N/A |

Referring to Table 6, the encoder and decoder composed of the neural network have a greater complexity than the turbo encoder and turbo decoder.

Therefore, it is necessary to design an autoencoder with reduced complexity while maintaining performance. Here, in that the distance characteristic is affected by the encoder, not the decoder, the complexity of the neural network encoder and the neural network decoder can be reduced by designing an encoder composed of a neural network to improve a distance or Euclidean distance.

First, the structure of a neural network encoder will be described.

Figure 29:
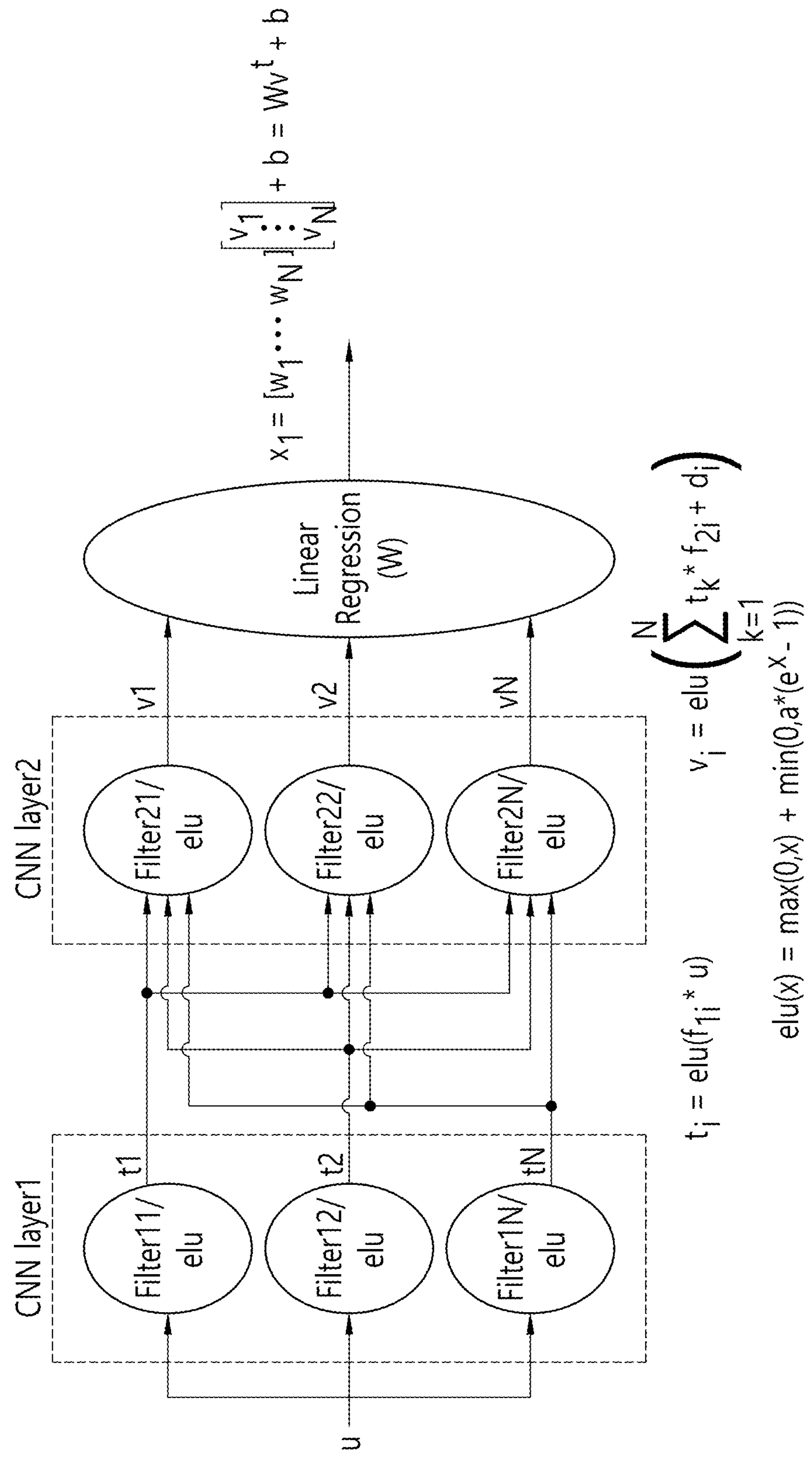
FIG. 29 shows an example in which $f_{i,\theta}$ is implemented as a 2-layer CNN in a neural network encoder.

FIG. 29 shows an example in which $f_{i,\theta}$ is implemented as a 2-layer CNN in a neural network encoder. Here, an example of the neural network encoder may be shown in (a) of FIG. 28.

Referring to FIG. 29, elu(x) is an activation function of elu(x)=max(0, x)+min(0, α($e^x$−1)), and * denotes a convolution operation method. In general, when analyzing encoder characteristics, a minimum distance becomes an important design parameter, which means a minimum value among distances between codewords generated by the encoder. Therefore, a code with good performance can be designed by maximizing the minimum distance of codewords. By employing such a design method, two input data sequences that do not have a large difference in the input data block are considered.

For example, for an input data block of length 10, two input data sequences differing by one bit are $u_0$=[0, 0, 0, 0, 0, 0, 0, 0, 0, 0] and $u_1$=[0, 0, 1, 0, 0, 0, 0, 0, 0, 0]. That is, maximizing the minimum distance for input data sequences in which the positions of codewords having different values are not relatively large can improve codeword performance, accordingly, complexity improvement such as reducing the number N of filters and the number of layers in FIG. 29 can be expected.

Figure 30:
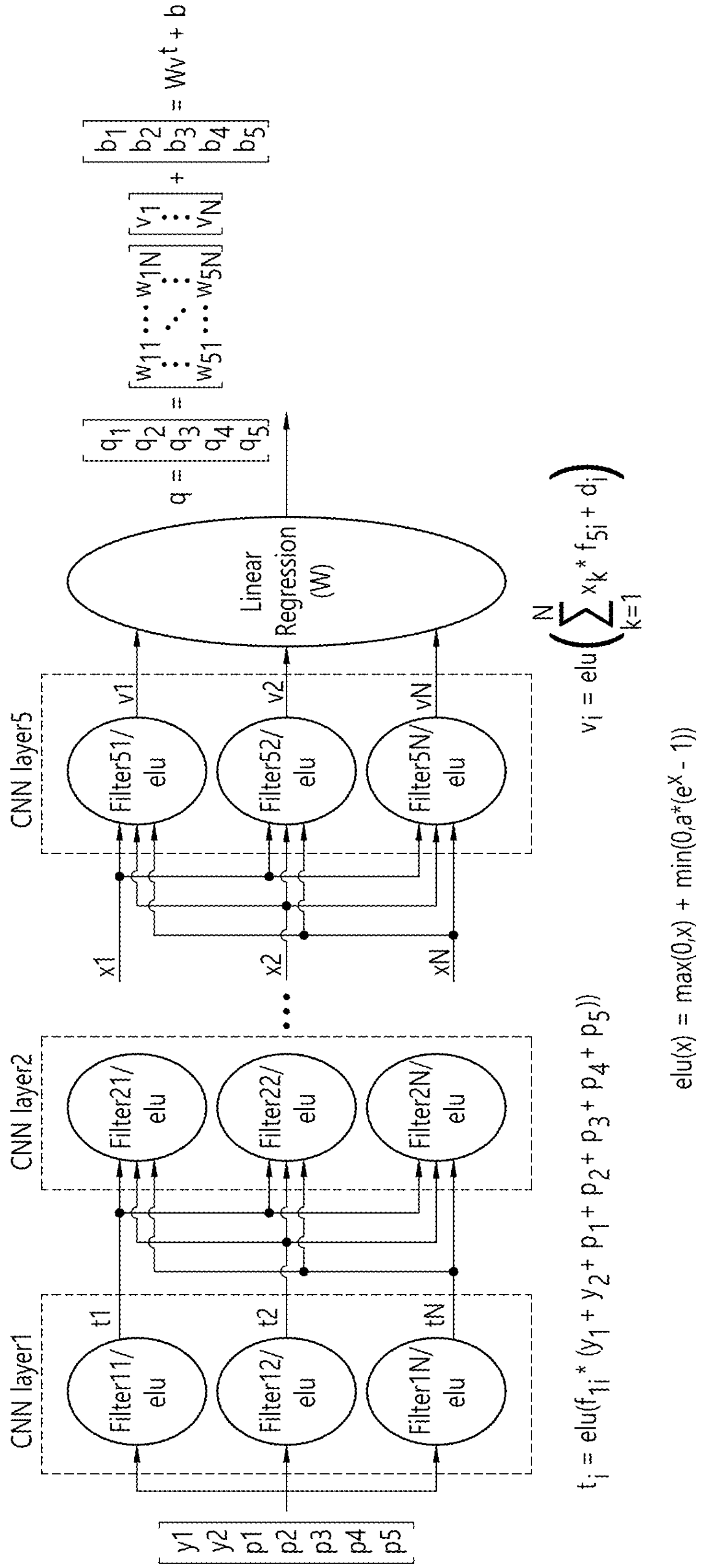
FIG. 30 illustrates an embodiment of $g_{0i,j}$ of a neural network decoder composed of a 5-layer CNN.

FIG. 30 illustrates an embodiment of $g_{0i,j}$ of a neural network decoder composed of a 5-layer CNN. Here, $y_i=x_i+n_i$ (where i=1, 2, 3), and $n_i$ is additive white Gaussian noise (AWGN).

In the following, the proposal of the present disclosure will be described in more detail. Specifically, the structure of the neural network proposed in this specification will be described below.

The following drawings are made to explain a specific example of the present specification. Since the names of specific devices or names of specific signals/messages/fields described in the drawings are provided as examples, the technical features of the present specification are not limited to the specific names used in the drawings below.

Figure 31:
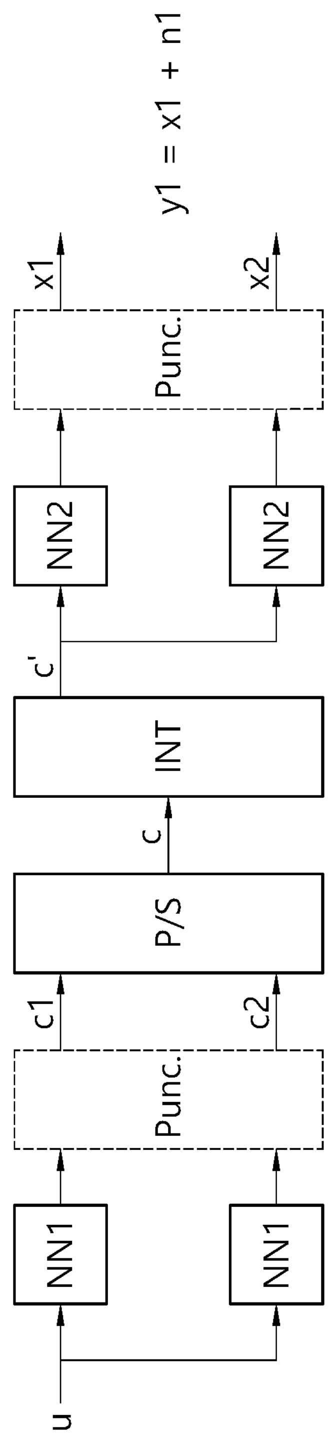
FIG. 31 shows an example of a neural network encoder structure proposed in this specification.

FIG. 31 shows an example of a neural network encoder structure proposed in this specification.

Referring to FIG. 31, each of NN1 and NN2 may be referred to as an outer encoder, and each of NN3 and NN4 may be referred to as an inner encoder. Here, a method of merging NN1 and NN2 with each other to implement a single neural network encoder may be considered, and NN3 and NN4 may also be merged with each other to implement a single neural network encoder. Also, the P/S block is a block that performs an operation of converting from parallel to serial, that is, a parallel-to-serial operation, and the INT block means an interleaver.

Referring to FIG. 31, in order to adjust the code rate of the neural network encoder system, puncturing may be performed at output end of an outer encoder and an inner encoder. The puncturing to generate a specific code rate may be performed on both output ends of the outer and inner encoders, or may be performed on only one encoder. In addition, a method of performing puncturing may be set differently for each code rate.

Figure 32:
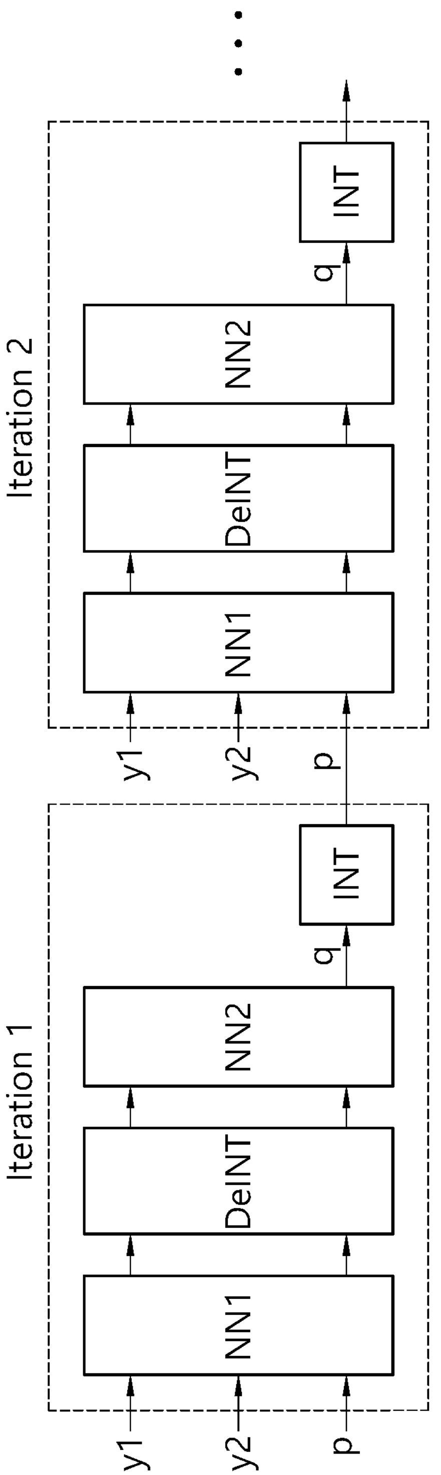
FIG. 32 illustrates a neural network decoder structure corresponding to the neural network encoder structure of FIG. 31.

FIG. 32 illustrates a neural network decoder structure corresponding to the neural network encoder structure of FIG. 31.

Referring to FIG. 32, the neural network decoder performs iterative decoding. Here, DeINT is a block that performs deinterleaving, that is, it is a block that performs a process of converting signals rearranged and output by the interleaver into their original order. Also, signal p may be prior information. Also, as an example, NN1 in FIG. 32 may be a neural network for interpreting/detecting the neural networks of NN3 and NN4 in FIG. 31, and NN2 in FIG. 32 may be a neural network for interpreting/detecting the neural networks of NN1 and NN2 in FIG. 31. Also, INT of FIG. 32 is an interleaver, and may be used to match dimensions between inputs and outputs.

Figure 33:
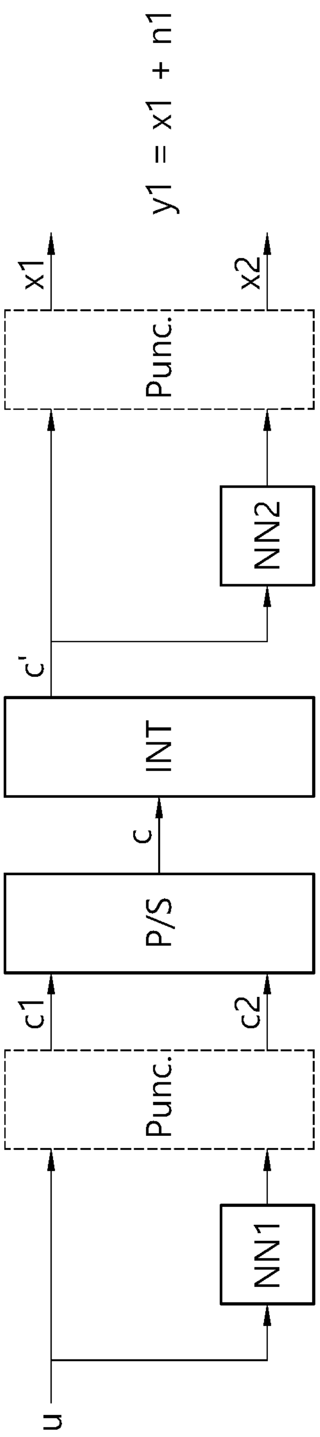
FIG. 33 illustrates another example of a neural network encoder structure proposed in this specification.

FIG. 33 illustrates another example of a neural network encoder structure proposed in this specification.

FIG. 33 illustrates an embodiment of a neural network encoder having systematic features. Structural features can be added to improve distance characteristics. Specifically, when adding a structural feature, it may be added to both the outer encoder and the inner encoder, or only to one of the outer encoder and the inner encoder. Meanwhile, a neural network decoder for the neural network encoder of FIG. 33 may use the structure of FIG. 32.

Figure 34:
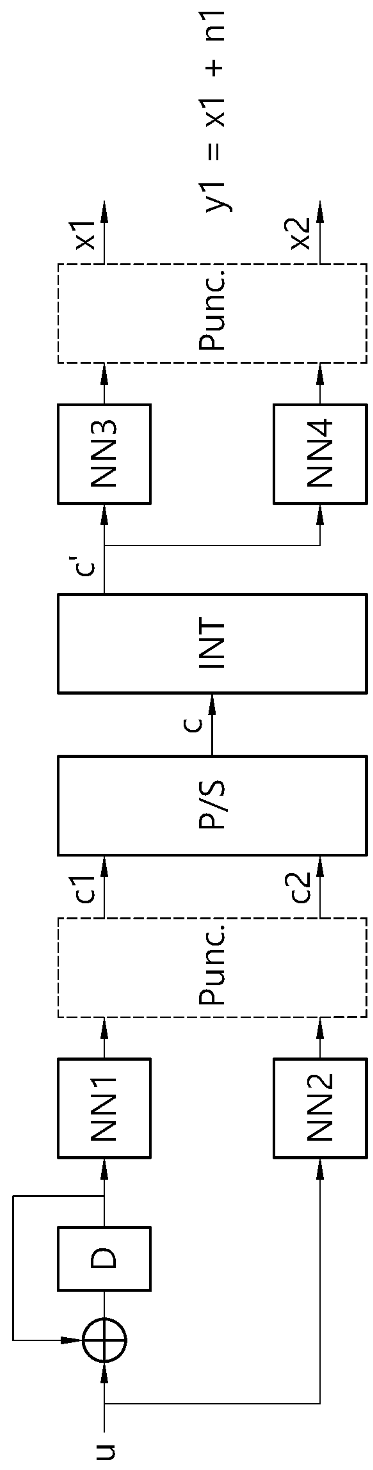
FIG. 34 shows another example of a neural network encoder structure proposed in this specification.

FIG. 34 shows another example of a neural network encoder structure proposed in this specification.

Referring to FIG. 34, distance characteristics can be improved by inserting an accumulator into an outer encoder part. In addition, a systematic feature may be added to the outer encoder part or the inner encoder part. That is, FIG. 34 discloses a connection having a systematic feature for an outer encoder, but may also have a structural feature for an inner encoder. In addition, D in FIG. 34 means delay, and an exclusive OR operation is applied in the front part of D in FIG. 34. Meanwhile, a neural network decoder for the neural network encoder of FIG. 34 may use the structure of FIG. 32.

Figure 35:
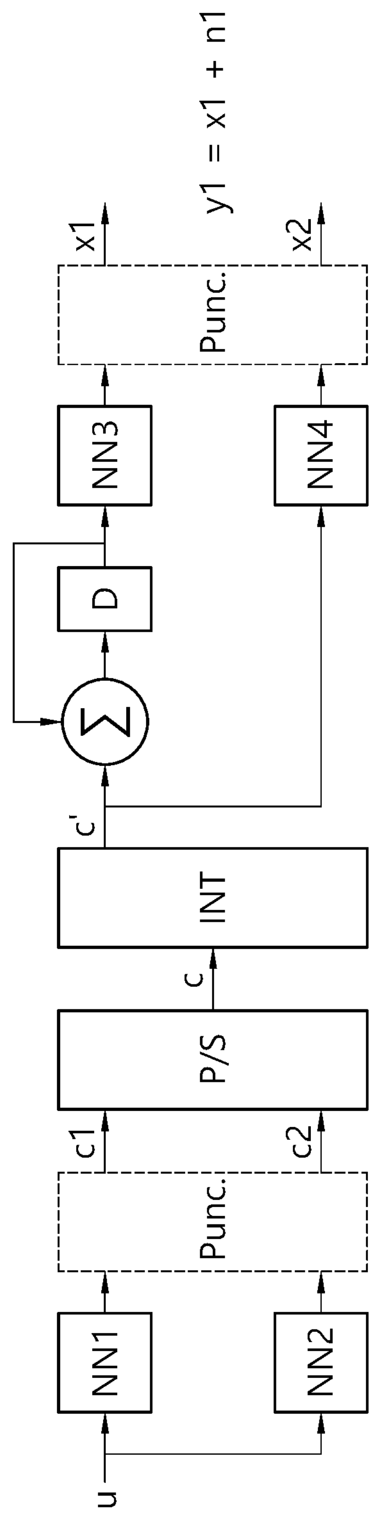
FIG. 35 shows another example of a neural network encoder structure proposed in this specification.

FIG. 35 shows another example of a neural network encoder structure proposed in this specification.

Referring to FIG. 35, the distance characteristic can be further improved by inserting an accumulator into the inner encoder part. At this time, since the output of the outer encoder is a real value, the sum of the inner encoder parts becomes the sum of the real values. Therefore, a normalization operation is required to prevent the value from diverging. That is, when the output of the sum is c"(t), it can be expressed as $c''(t)=\alpha\cdot c'(t)+(1-\alpha)\cdot c'(t-1)$. Here, $\alpha$ may be a value greater than 0 and less than 1.

Alternatively, a sigmoid function or a hyperbolic tangent function may be applied to the summation output to control the divergence of the corresponding value. Alternatively, the divergence of the corresponding value may be controlled by applying a sigmoid function or a hyperbolic tangent function to the delay output. This method may be more effective as the length of the codeword is longer. Meanwhile, a neural network decoder for the neural network encoder of FIG. 35 may use the structure of FIG. 32.

Figure 36:
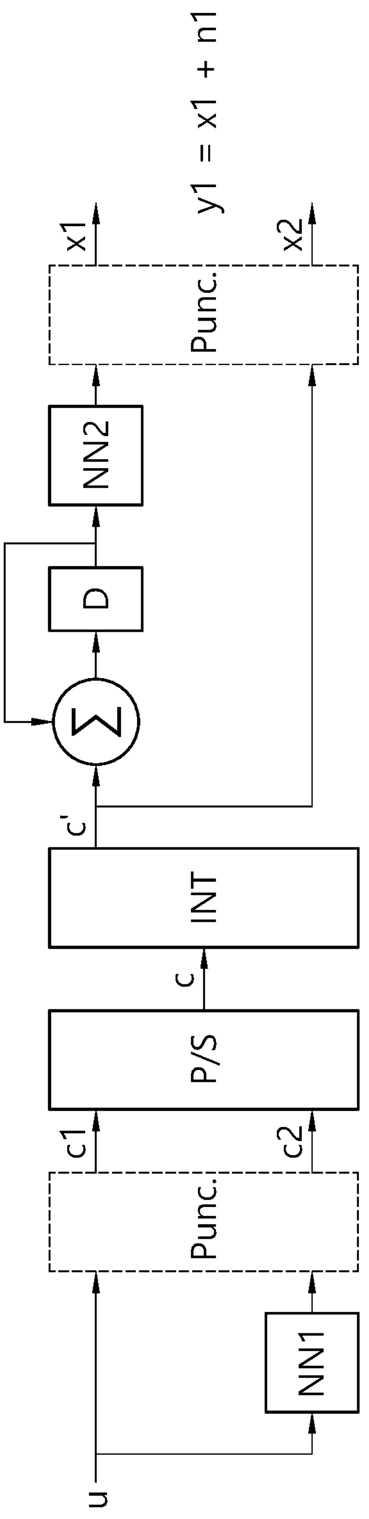
FIG. 36 shows another example of a neural network encoder structure proposed in this specification.

FIG. 36 shows another example of a neural network encoder structure proposed in this specification.

FIG. 36 is an embodiment of a neural network encoder having systematic features. Structural features can be added to improve distance characteristics. When adding a structural feature, it can be added to both the outer encoder and the inner encoder or only to either one. In addition, the summation output divergence control method described in FIG. 35 may also be applied to the example of FIG. 36. Meanwhile, a neural network decoder for the neural network encoder of FIG. 36 may use the structure of FIG. 32.

Hereinafter, signaling of neural network parameters will be described.

An autoencoder consists of both a transmitter and a receiver as neural networks. Since the neural network operates after optimizing parameters through training, information on neural network parameters can be signaled from a device where training is performed to a transmitter or receiver. In the case of downlink, the neural network encoder operates on the side of the base station and the neural network decoder operates on the side of the UE. In the case of uplink, a neural network encoder operates on the UE side and a neural network decoder operates on the base station side.

Hereinafter, an embodiment of training of a neural network proposed in this specification will be described.

When training is performed in a device other than a neural network encoder or a neural network decoder, corresponding neural network parameters may be transmitted from the device in which training is performed to a transmitter in which the neural network encoder operates and a receiver in which the neural network decoder operates. When a device performing training is outside the base station, neural network parameters may be transmitted to the base station or the UE.

For example, parameters of the neural network encoder and the neural network decoder may be transmitted to the base station. At this time, it is possible to use not only a cellular network but also an existing Internet network. After the base station acquires information about parameters of the neural network encoder and neural network decoder, the base station may transmit information about the neural network encoder or the neural network decoder to the UE through a cellular network. That is, the base station may transmit parameter information of the neural network decoder to the UE for downlink data transmission, and the base station may transmit parameter information of the neural network encoder to the UE for uplink data transmission. Here, when transmitting parameter information to the UE, RRC/MAC/L1 signaling may be used.

Hereinafter, another embodiment of training of a neural network proposed in this specification will be described.

When training is performed in a base station or UE operating as a neural network encoder or neural network decoder, information on neural network parameters should be transmitted to the UE or base station.

For example, when training is performed in a base station, the base station transmits parameter information of a neural network decoder to a UE for downlink data transmission, and the base station transmits parameter information of a neural network encoder to a UE for uplink data transmission. When transmitting to the UE, RRC/MAC/L1 signaling may be used.

Also, when the UE performs training, the UE transmits parameter information of the neural network encoder to the base station for downlink data transmission, and the UE transmits parameter information of the neural network decoder to the base station for uplink data transmission. When transmitting to the base station, RRC/MAC/L1 signaling may be used.

Hereinafter, a signaling method of neural network parameters will be described.

In the structure of the above-described neural network encoder and neural network decoder, information on the type and number of layers of the neural network, activation function for each layer, loss function, optimization method, learning rate, training data set, test data set, etc. can be transmitted. In addition, weights of neural network encoders or neural network decoders may be transmitted for each corresponding layer. At this time, in addition to the above information, information related to the neural network may be transmitted together.

For example, in the case of CNN, information on the dimension of the convolutional layer, kernel size, dilation, stride, padding, number of input channels, and number of output channels can be transmitted. In addition, in the case of an RNN, information on the RNN type, input shape, output shape, initial input state, output hidden state, and the like can be transmitted.

When generating a training data set and a test data set, a pseudo random sequence generator operating in the same initial state may be used in a transmitter and a receiver. For example, after initializing a gold sequence generator having the same generator polynomial with the same initial state, the same part of the generated sequence may be set as a training data set and a test data set.

Instead of transmitting information such as a weight of a neural network encoder or a neural network decoder, a signaling burden may be reduced by pre-defining information such as a standard. In this case, both the neural network encoder and the neural network decoder can be defined in advance.

Alternatively, only the weight of the neural network encoder may be predefined and signaled in a standard or the like, and the weight of the neural network decoder may be obtained through training in the receiver. At this time, parameters of the neural network decoder capable of obtaining the minimum performance of the neural network decoder may be transmitted to the receiver. In this method, when the receiver is a UE, better performance can be obtained by optimizing the parameters of the neural network decoder when the UE is implemented. Alternatively, a weight value of a neural network encoder may be signaled.

Furthermore, the parameter a used in the normalization method among the methods for preventing the divergence of the aforementioned value may be transmitted using a signaling method such as L1/MAC/RRC signaling, and may be applied to both downlink and uplink. In this case, a value used for downlink and a value used for uplink may be independently set or may be set to the same value. Alternatively, a fixed value rather than a variable value can be used.

In addition, the function used for the output of the sum in FIGS. 35 and 36 may be informed by signaling from the base station/edge server to the UE/edge device. Alternatively, the function used for the output of the sum may be defined in advance by a standard or the like.

That is, the examples of FIGS. 31 to 36 show embodiments in which an encoder performing concatenated coding is configured as a neural network, in that an input signal passes through and is encoded in the order of a first neural network-interleaver-second neural network. Specifically, the first neural network may mean an outer encoder, and the second neural network may mean an inner encoder, respectively.

Figure 37:
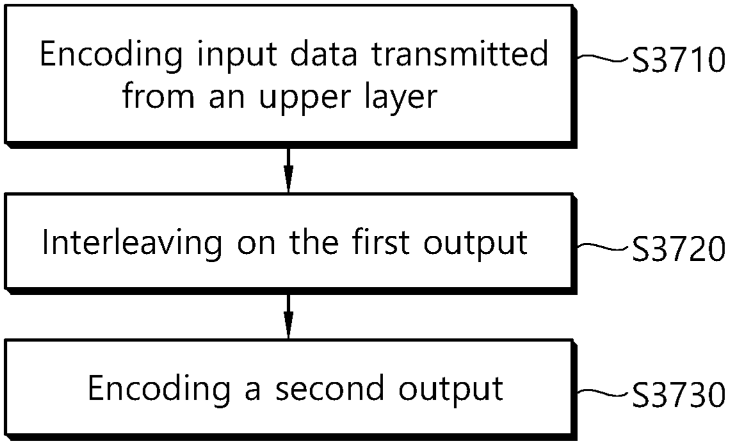
FIG. 37 illustrates an example of an encoding method of a neural network encoder structure according to some implementations of the present disclosure.

FIG. 37 illustrates an example of an encoding method of a neural network encoder structure according to some implementations of the present disclosure. The example of FIG. 37 can be performed by the neural network encoder structure of FIGS. 31 to 36.

Referring to FIG. 37, the neural network encoder encodes input data transmitted from an upper layer (S3710). Here, as an example, the upper layer may be a MAC layer.

Thereafter, the neural network encoder performs interleaving on the first output that is the output of the first encoding step (S3720).

Thereafter, the neural network encoder encodes a second output, which is an output obtained by interleaving the first output (S3730).

Here, each of the first encoding step and the second encoding step may be performed based on one or more neural networks.

The claims set forth herein can be combined in a variety of ways. For example, the technical features of the method claims of this specification may be combined to be implemented as an apparatus, and the technical features of the apparatus claims of this specification may be combined to be implemented as a method. In addition, the technical features of the method claims of the present specification and the technical features of the apparatus claims may be combined to be implemented as an apparatus, and the technical features of the method claims of the present specification and the technical features of the apparatus claims may be combined to be implemented as a method.

The methods proposed in this specification can be performed not only by a neural network encoder and a UE/edge device including the neural network encoder, but also by a CRM and an apparatus configured to control a UE. The CRM includes instructions based on being executed by at least one processor. The apparatus includes one or more processors and one or more memories operably connected by the one or more processors and storing instructions, wherein the one or more processors execute the instructions to perform the methods proposed herein. In addition, according to the methods proposed in this specification, it is obvious that an operation by a base station/edge server corresponding to an operation performed by a UE/edge device can be considered.

What is claimed is:

1. An encoding method performed by a neural network encoder in a user equipment (UE) in a wireless communication system, the method comprising:
- a first encoding step, by a first neural network, of encoding input data from a medium access control (MAC) layer, wherein the first neural network is an outer encoder;
- an interleaving step of performing interleaving on a first output of the first encoding step;
- a second encoding step, by a second neural network, of encoding a second output of the interleaving step, wherein the second neural network is an inner encoder;
- a normalization step of performing a normalization operation on an output of the inner encoder to control a divergence of values within the neural network encoder, wherein the normalization operation is based on a weighted sum of a current output and a previous output of the inner encoder; and
- a puncturing step of performing puncturing at an output of at least one of the outer encoder and the inner encoder to generate a specific code rate for data transmission,
- wherein the neural network encoder receives information on a parameter for the normalization operation for the first neural network and the second neural network from a base station.

2. The method of claim 1, wherein each of the first encoding step and the second encoding step is performed based on a plurality of parallel-connected neural networks.

3. The method of claim 2, wherein the neural network encoder is configured to perform the interleaving after performing parallel-to-serial conversion on the first output.

4. The method of claim 1, wherein the first encoding step is performed based on the one or more neural networks and a first accumulator; and
- wherein the first accumulator is configured to perform an exclusive OR operation.

5. The method of claim 1, wherein the second encoding step is performed based on the one or more neural networks and a second accumulator; and
- wherein the second accumulator is configured to perform a summation operation.

6. The method of claim 5, wherein the neural network encoder is configured to apply a function to an output of the summation operation.

7. The method of claim 6, wherein the function is a sigmoid function or a hyperbolic tangent function.

8. The method of claim 6, wherein the neural network encoder is configured to receive function information indicating the function from a base station or an edge server.

9. The method of claim 5, wherein the neural network encoder multiplies an output of the summation operation by a parameter greater than 0 and less than 1.

10. The method of claim 1, wherein the neural network encoder is configured to perform puncturing on at least one of the first output and a third output which is an output of the second encoding step.

11. The method of claim 1, wherein the one or more neural networks comprises a systematic connection.

12. The method of claim 1, wherein the neural network encoder is included in a user equipment (UE), a base station, an edge device, or an edge server.

13. A neural network encoder, the neural network encoder comprising:
- at least one memory storing instructions;
- at least one transceiver; and
- at least one processor coupling the at least one memory and the at least one transceiver, wherein the at least one processor is configured to execute the instructions,
- wherein the at least one processor performs is configured to perform:
- a first encoding step, by a first neural network, of encoding input data from a medium access control (MAC) layer, wherein the first neural network is an outer encoder;
- an interleaving step of performing interleaving on a first output of the first encoding step;
- a second encoding step, by a second neural network, of encoding a second output of the interleaving step, wherein the second neural network is an inner encoder;
- a normalization step of performing a normalization operation on an output of the inner encoder to control a divergence of values within the neural network encoder, wherein the normalization operation is based on a weighted sum of a current output and a previous output of the inner encoder; and
- a puncturing step of performing puncturing at an output of at least one of the outer encoder and the inner encoder to generate a specific code rate for data transmission,
- wherein the neural network encoder receives information on a parameter for the normalization operation for the first neural network and the second neural network from a base station.

14. An apparatus configured to control a neural network encoder, the apparatus comprising:
- at least one processor; and
- at least one memory executably coupled to the at least one processor and storing instructions,
- wherein the at least one processor is configured to execute the instructions,
- wherein the at least one processor is configured to perform:
- a first encoding step, by a first neural network, of encoding input data from a medium access control (MAC) layer, wherein the first neural network is an outer encoder;
- an interleaving step of performing interleaving on a first output of the first encoding step;
- a second encoding step, by a second neural network, of encoding a second output of the interleaving step, wherein the second neural network is an inner encoder;
- a normalization step of performing a normalization operation on an output of the inner encoder to control a divergence of values within the neural network encoder, wherein the normalization operation is based on a weighted sum of a current output and a previous output of the inner encoder; and
- a puncturing step of performing puncturing at an output of at least one of the outer encoder and the inner encoder to generate a specific code rate for data transmission,
- wherein the neural network encoder receives information on a parameter for the normalization operation for the first neural network and the second neural network from a base station.

* * * * *